United States Patent
Ni et al.

(10) Patent No.: US 12,101,911 B2
(45) Date of Patent: Sep. 24, 2024

(54) HEAT EXCHANGE SYSTEM USED FOR HEAT DISSIPATION OF ELECTRONIC CONTROL ASSEMBLY AND COMPUTER HOST

(71) Applicant: SANHUA (HANGZHOU) MICRO CHANNEL HEAT EXCHANGER CO., LTD., Zhejiang (CN)

(72) Inventors: Xiaoming Ni, Zhejiang (CN); Jianlong Jiang, Zhejiang (CN); Qiang Gao, Zhejiang (CN)

(73) Assignee: SANHUA (HANGZHOU) MICRO CHANNEL HEAT EXCHANGER CO., LTD., Zhejiang (CN)

( * ) Notice: Subject to any disclaimer, the term of this patent is extended or adjusted under 35 U.S.C. 154(b) by 221 days.

(21) Appl. No.: 17/771,253

(22) PCT Filed: Oct. 23, 2020

(86) PCT No.: PCT/CN2020/123159
§ 371 (c)(1),
(2) Date: Apr. 22, 2022

(87) PCT Pub. No.: WO2021/078244
PCT Pub. Date: Apr. 29, 2021

(65) Prior Publication Data
US 2022/0408600 A1    Dec. 22, 2022

(30) Foreign Application Priority Data

Oct. 24, 2019   (CN) .......................... 201911018969.0
Oct. 24, 2019   (CN) .......................... 201911019742.8
(Continued)

(51) Int. Cl.
*H05K 7/20*   (2006.01)
*G06F 1/20*   (2006.01)

(52) U.S. Cl.
CPC ..... *H05K 7/20336* (2013.01); *H05K 7/20327* (2013.01); *H05K 7/20381* (2013.01); *G06F 1/206* (2013.01)

(58) Field of Classification Search
CPC .......... H05K 7/20336; H05K 7/20327; H05K 7/20381; G06F 1/206
(Continued)

(56) References Cited

U.S. PATENT DOCUMENTS 3,609,991 A * 10/1971 Chu et al. ............. H01L 23/427
174/15.1
5,203,399 A *  4/1993 Koizumi ............... F25B 23/006
361/699

(Continued)

FOREIGN PATENT DOCUMENTS

CN      1529360 A    9/2004
CN    101871740 A   10/2010
(Continued)

OTHER PUBLICATIONS

International Search Report dated Jan. 10, 2021, for corresponding International Application No. PCT/CN2020/123159, filed Oct. 23, 2020.
(Continued)

*Primary Examiner* — Anatoly Vortman
(74) *Attorney, Agent, or Firm* — David D. Brush; Westman, Champlin & Koehler, P.A.

(57) ABSTRACT

A heat exchange system for heat dissipation of an electronic control assembly includes: a first heat exchange portion including a first end having a first communication port and a second end having a second communication port; a second heat exchange portion including a first end having a third communication port and a second end having a fourth communication port, and at least a part of the second heat
(Continued)

exchange portion being configured to be in contact with the electronic control assembly; a first connection tube communicating the first communication port with the third communication port; and a second connection tube communicating the second communication port with the fourth communication port. The first and second heat exchange portions and the first and second connection tubes constitute a loop, the loop has an opening, and the opening is closed when the heat exchange system is in an operative state.

19 Claims, 10 Drawing Sheets

(30) Foreign Application Priority Data

| | | | |
|---|---|---|---|
| Oct. 24, 2019 | (CN) | | 201921803029.8 |
| Jan. 6, 2020 | (CN) | | 202020024116.X |

(58) Field of Classification Search
USPC .................................................. 361/679.52
See application file for complete search history.

(56) References Cited

U.S. PATENT DOCUMENTS

| | | | | |
|---|---|---|---|---|
| 5,587,880 | A * | 12/1996 | Phillips | F28F 3/12 |
| | | | | 361/679.53 |
| 5,731,954 | A * | 3/1998 | Cheon | G06F 1/20 |
| | | | | 174/15.1 |
| 6,679,315 | B2 * | 1/2004 | Cosley | H05K 1/0203 |
| | | | | 257/E23.098 |
| 6,754,076 | B2 * | 6/2004 | Cox | F04D 1/06 |
| | | | | 174/15.1 |
| 6,856,037 | B2 * | 2/2005 | Yazawa | F03G 7/00 |
| | | | | 290/43 |
| 7,508,672 | B2 * | 3/2009 | Hamman | F28D 15/00 |
| | | | | 361/689 |
| 9,818,671 | B2 * | 11/2017 | Huang | H01L 23/467 |
| 10,416,736 | B2 * | 9/2019 | Dupont | H05K 7/20936 |
| 2003/0209343 | A1 * | 11/2003 | Bingler | F04D 25/026 |
| | | | | 257/E23.098 |
| 2005/0180105 | A1 * | 8/2005 | Matsushima | H01L 23/473 |
| | | | | 257/E23.098 |
| 2006/0021737 | A1 * | 2/2006 | Lee | H01L 23/473 |
| | | | | 257/E23.098 |
| 2007/0175610 | A1 * | 8/2007 | Yeh | H01L 23/473 |
| | | | | 257/E23.098 |
| 2009/0044929 | A1 * | 2/2009 | Yeh | F28D 15/00 |
| | | | | 165/104.19 |

FOREIGN PATENT DOCUMENTS

| | | |
|---|---|---|
| CN | 207399729 U | 5/2018 |
| CN | 108168142 A | 6/2018 |
| CN | 210835974 U | 6/2020 |

OTHER PUBLICATIONS

Written Opinion of the International Searching Authority dated Jan. 10, 2021, for corresponding International Application No. PCT/CN2020/123159, filed Oct. 23, 2020.
English translation of the Written Opinion of the International Searching Authority dated Feb. 1, 2021 for corresponding International Application No. PCT/CN2020/123159, filed Oct. 23, 2020.
Chinese Office Action dated Nov. 18, 2022 for corresponding Chinese Application No. 201911018969.0, filed Oct. 24, 2019.
Chinese Office Action dated Nov. 18, 2022 for corresponding Chinese Application No. 201911019742.8, filed Oct. 24, 2019.

* cited by examiner

HEAT EXCHANGE SYSTEM USED FOR HEAT DISSIPATION OF ELECTRONIC CONTROL ASSEMBLY AND COMPUTER HOST

CROSS REFERENCES TO RELATED APPLICATIONS

The present application is a national phase entry under 35 USC § 371 of International Application No. PCT/CN2020/123159, filed on Oct. 23, 2020, which claims the benefit of priority to Chinese Applications No. 201921803029.8, 201911018969.0, and 201911019742.8 filed on Oct. 24, 2019, and Chinese Application No. 202020024116.X filed on Jan. 6, 2020, all of which are incorporated by reference herein in their entireties for all purposes.

FIELD

Embodiments of the present disclosure relate to a field of heat exchange, and more particularly, to a heat exchange system for heat dissipation of an electronic control assembly and a computer host having the same.

BACKGROUND

A radiator for an electronic control assembly mainly includes a heat tube radiator. As known to the inventors, the heat tube radiator has a small amount of heat exchange due to a limited contact area of a single heat tube, and the heat dissipation effect needs to be improved.

SUMMARY

A heat exchange system for heat dissipation of an electronic control assembly according to the embodiments of a first aspect of the present disclosure includes: a first heat exchange portion including a first end of the first heat exchange portion and a second end of the first heat exchange portion arranged opposite to each other, the first end of the first heat exchange portion having a first communication port, the second end of the first heat exchange portion having a second communication port, and the first communication port being in communication with the second communication port; a second heat exchange portion including a first end of the second heat exchange portion and a second end of the second heat exchange portion arranged opposite to each other, the first end of the second heat exchange portion having a third communication port, the second end of the second heat exchange portion having a fourth communication port, the fourth communication port being in communication with the third communication port, and at least a part of the second heat exchange portion being configured to be in contact with the electronic control assembly, so as to be in conduction with the electronic control assembly to dissipate heat; a first connection tube including a first end of the first connection tube and a second end of the first connection tube, the first end of the first connection tube being connected to the first end of the first heat exchange portion through the first communication port, and the second end of the first connection tube being connected to the first end of the second heat exchange portion through the third communication port, so as to communicate the first heat exchange portion with the second heat exchange portion; and a second connection tube including a first end of the second connection tube and a second end of the second connection tube, the first end of the second connection tube being connected to the second end of the first heat exchange portion through the second communication port, and the second end of the second connection tube being connected to the second end of the second heat exchange portion through the fourth communication port, so as to communicate the first heat exchange portion with the second heat exchange portion. The first heat exchange portion, the first connection tube, the second heat exchange portion and the second connection tube constitute a loop, at least one of the first heat exchange portion, the first connection tube, the second heat exchange portion and the second connection tube has an opening, and the opening is closed when the heat exchange system is in an operative state. The second end of the first heat exchange portion is not higher than the first end of the first heat exchange portion in a direction of gravity, the second end of the second heat exchange portion is lower than the first end of the second heat exchange portion in the direction of gravity, the third communication port is lower than the first communication port in the direction of gravity, and the fourth communication port is lower than the second communication port in the direction of gravity.

A computer host according to the embodiments of a second aspect of the present disclosure includes: a chassis; a main board arranged in the chassis, an electronic control assembly being mounted on the main board and including a chip; a fan or a blower arranged in the chassis; and a heat exchange system arranged in the chassis. The heat exchange system includes: a first heat exchange portion including a first end of the first heat exchange portion and a second end of the first heat exchange portion arranged opposite to each other, the first end of the first heat exchange portion having a first communication port, the second end of the first heat exchange portion having a second communication port, and the first communication port being in communication with the second communication port; a second heat exchange portion including a first end of the second heat exchange portion and a second end of the second heat exchange portion arranged opposite to each other, the first end of the second heat exchange portion having a third communication port, the second end of the second heat exchange portion having a fourth communication port, the fourth communication port being in communication with the third communication port, and at least a part of the second heat exchange portion being configured to be in contact with the electronic control assembly, so as to be in conduction with the electronic control assembly to dissipate heat; a first connection tube including a first end of the first connection tube and a second end of the first connection tube, the first end of the first connection tube being connected to the first end of the first heat exchange portion through the first communication port, and the second end of the first connection tube being connected to the first end of the second heat exchange portion through the third communication port, so as to communicate the first heat exchange portion with the second heat exchange portion; and a second connection tube including a first end of the second connection tube and a second end of the second connection tube, the first end of the second connection tube being connected to the second end of the first heat exchange portion through the second communication port, and the second end of the second connection tube being connected to the second end of the second heat exchange portion through the fourth communication port, so as to communicate the first heat exchange portion with the second heat exchange portion. The first heat exchange portion, the first connection tube, the second heat exchange portion and the second connection tube constitute a loop, at least one of the first heat exchange portion, the first connection tube, the second heat exchange portion and the second connection tube has an opening, and the opening is closed when the heat exchange system is in an operative state. The second end of the first heat exchange portion is not higher than the first end of the first heat exchange portion in a direction of gravity, the second end of the second heat exchange portion is lower than the first end of the second heat exchange portion in the direction of gravity, the third communication port is lower than the first communication port in the direction of gravity, and the fourth communication port is lower than the second communication port in the direction of gravity. The first heat exchange portion is arranged adjacent to the fan or the blower, a spacing is defined between the second heat exchange portion and the first heat exchange portion in a horizontal direction, at least a part of a surface of the second heat exchange portion is in contact with the chip, the second end of the first heat exchange portion is lower than the first end of the first heat exchange portion in the direction of gravity, the second end of the second heat exchange portion is lower than the first end of the second heat exchange portion in the direction of gravity, the third communication port is lower than the first communication port in the direction of gravity, and the fourth communication port is lower than the second communication port in the direction of gravity.

A heat exchange system for heat dissipation of an electronic control assembly according to the embodiments of a third aspect of the present disclosure includes: a first heat exchange assembly including a first tube, a second tube and a plurality of heat exchange tubes, the second tube and the first tube being spaced apart from each other, the plurality of heat exchange tubes being spaced apart from each other along a length direction of the first tube, one end of at least one of the heat exchange tubes in a length direction thereof being connected to the first tube, the other end of the at least one heat exchange tube in the length direction thereof being connected to the second tube, so as to communicate the first tube with the second tube, the first tube having a first communication port, and the second tube having a second communication port; a second heat exchange assembly including a third tube, a heat exchange component and a fourth tube, the fourth tube and the third tube being spaced apart from each other, the third tube having a third communication port, the fourth tube having a fourth communication port, the heat exchange component including a first component and at least one first flat tube, the first flat tube including a first side face and a second side face, the first side face and the second side face of the first flat tube being oppositely arranged in a thickness direction of the first flat tube, the first flat tube further including a third side face and a fourth side face, the third side face and the fourth side face of the first flat tube being oppositely arranged in a width direction of the first flat tube, a distance between the first side face and the second side face of the first flat tube being less than a distance between the third side face and the fourth side face of the first flat tube, one end of two opposite ends of the first flat tube in a length direction thereof being connected to the third tube, the other end of the two opposite ends of the first flat tube in the length direction thereof being connected to the fourth tube, the first flat tube including a plurality of first channels, the plurality of first channels being spaced apart from each other in the width direction of the first flat tube, the first channel extending in the length direction of the first flat tube, so as to communicate the third tube with the fourth tube, a part of the first component being configured to be in contact with the first side face or the second side face of the first flat tube, and at least a part of the rest of the first component being configured to be in contact with the electronic control assembly, so as to be in conduction with the electronic control assembly to dissipate heat; a first connection tube including a first end of the first connection tube and a second end of the first connection tube, the first end of the first connection tube being connected to the first tube through the first communication port, and the second end of the first connection tube being connected to the third tube through the third communication port, so as to communicate the first tube with the third tube; and a second connection tube including a first end of the second connection tube and a second end of the second connection tube, the first end of the second connection tube being connected to the second tube through the second communication port, and the second end of the second connection tube being connected to the fourth tube through the fourth communication port, so as to communicate the second tube with the fourth tube. When the heat exchange system is in use, a junction of the at least one heat exchange tube of the first heat exchange assembly to the second tube is not higher than a junction of the at least one heat exchange tube to the first tube in a direction of gravity, a junction of the at least one first flat tube of the second heat exchange assembly to the fourth tube is lower than a junction of the at least one first flat tube to the third tube in the direction of gravity, a position of the third communication port is lower than a position of the first communication port in the direction of gravity, and a position of the fourth communication port is lower than a position of the second communication port in the direction of gravity.

DETAILED DESCRIPTION

Figure 1:
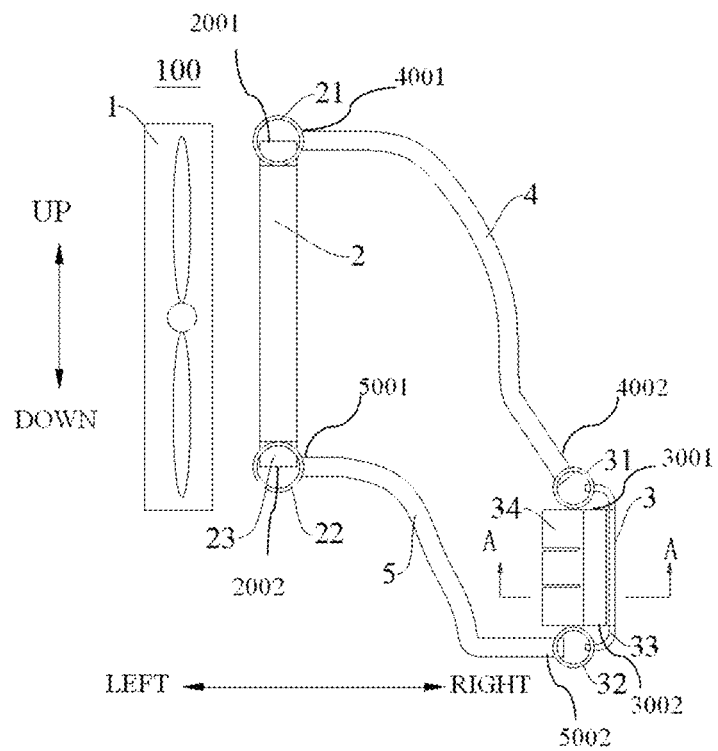
FIG. 1 is a schematic view of a heat exchange system for heat dissipation of an electronic control assembly according to an embodiment of the present disclosure.

Embodiments of the present disclosure are described in detail below, and examples of the embodiments are shown in accompanying drawings. The following embodiments described with reference to the accompanying drawings are exemplary and are only intended to explain the present disclosure, rather than limit the present disclosure. In the description of the present disclosure, it shall be understood that terms such as "central," "longitudinal," "transverse," "length," "width," "thickness," "upper," "lower," "front," "rear," "left," "right," "vertical," "horizontal," "top," "bottom," "inner," "outer," "clockwise," "counterclockwise," "axial," "radial" and "circumferential" should be construed to refer to the orientation as then described or as shown in the drawings under discussion. These relative terms are only for convenience of description and do not indicate or imply that the device or element referred to must have a particular orientation, or be constructed and operated in a particular orientation. Thus, these terms shall not be construed as limitation on the present disclosure.

As shown in FIGS. 1 to 28, a heat exchange system 100 for heat dissipation of an electronic control assembly according to embodiments of the present disclosure includes a first heat exchange portion, a second heat exchange portion, a first connection tube 4, and a second connection tube 5. The first heat exchange portion includes a first end 2001 of the first heat exchange portion and a second end 2002 of the first heat exchange portion. A first communication port is arranged at the first end 2001 of the first heat exchange portion, a second communication port is arranged at the second end 2002 of the first heat exchange portion, and the first communication port is in communication with the second communication port.

The second heat exchange portion includes a first end 3001 of the second heat exchange portion and a second end 3002 of the second heat exchange portion. A third communication port is arranged at the first end 3001 of the second heat exchange portion, a fourth communication port is arranged at the second end 3002 of the second heat exchange portion, and the fourth communication port is in communication with the third communication port. At least a part of a surface of the second heat exchange portion may be in contact with an electronic control assembly 200, so as to be in conduction with the electronic control assembly 200 to dissipate heat. The electronic control assembly includes a chip, and may further include modules such as a rectifier bridge or an IGBT (an insulated gate bipolar transistor), and these modules emit heat when operating, so that heat dissipation is required to reduce the temperature and improve the service life.

The first connection tube 4 includes a first end 4001 of the first connection tube and a second end 4002 of the first connection tube. The first end 4001 of the first connection tube is connected to the first end 2001 of the first heat exchange portion through the first communication port, and the second end 4002 of the first connection tube is connected to the first end 3001 of the second heat exchange portion through the third communication port, so as to communicate the first heat exchange portion with the second heat exchange portion. In other words, the first communication port is in communication with the third communication port through the first connection tube 4.

The second connection tube 5 includes a first end 5001 of the second connection tube and a second end 5002 of the second connection tube. The first end 5001 of the second connection tube is connected to the second end 2002 of the first heat exchange portion through the second communication port, and the second end 5002 of the second connection tube is connected to the second end 3002 of the second heat exchange portion through the fourth communication port, so as to communicate the first heat exchange portion with the second heat exchange portion. In other words, the second communication port is in communication with the fourth communication port through the second connection tube 5.

The first heat exchange portion, the first connection tube 4, the second heat exchange portion and the second connection tube 5 constitute a loop, and at least one of the first heat exchange portion, the first connection tube 4, the second heat exchange portion and the second connection tube 5 has an opening 211 or 221 or 310 or 320 or 410 or 510. The opening is closed when the heat exchange system 100 is in an operative state, and is opened only when a refrigerant needs to be charged or discharged in an inoperative state of the heat exchange system 100.

As shown in FIGS. 1 to 28, the first heat exchange portion is located on a left side of the second heat exchange portion. A left end of the first connection tube 4 is connected to the first end 2001 of the first heat exchange portion through the first communication port, and a right end of the first connection tube 4 is connected to the first end 3001 of the second heat exchange portion through the third communication port. A left end of the second connection tube 5 is connected to the second end 2002 of the first heat exchange portion through the second communication port, and a right end of the second connection tube 5 is connected to the second end 3002 of the second heat exchange portion through the fourth communication port.

When the heat exchange system 100 is in use, i.e., when the heat exchange system 100 is used to dissipate heat from the electronic control assembly 200, the second end 2002 of the first heat exchange portion is not higher than the first end 2001 of the first heat exchange portion in a direction of gravity, the second end 3002 of the second heat exchange portion is lower than the first end 3001 of the second heat exchange portion in the direction of gravity, the third communication port is lower than the first communication port in the direction of gravity, and the fourth communication port is lower than the second communication port in the direction of gravity. Therefore, a liquid refrigerant in the second heat exchange portion absorbs the heat from the electronic control assembly 200 and is converted into a gaseous refrigerant, and then the gaseous refrigerant enters the first heat exchange portion through the first connection tube 4. The gaseous refrigerant in the first heat exchange portion is condensed into the liquid refrigerant and then the liquid refrigerant enters the second heat exchange portion through the second connection tube 5.

In the heat exchange system 100 for heat dissipation of the electronic control assembly according to the embodiments of the present disclosure, the first heat exchange portion and the second heat exchange portion are provided and in communication with each other, so that the first heat exchange portion serves as a condenser, and the second heat exchange portion serves as a heat dissipation module for the electronic control assembly 200. By adopting the separate first heat exchange portion and second heat exchange portion for heat dissipation of the electronic control assembly 200, the heat-exchange area is increased, and more refrigerant can be charged into the system, thus providing a large amount of heat exchange, and improving the heat dissipation effect for the electronic control assembly 200.

In addition, in some applications known to the inventors, the electronic control assembly 200 adopts a water cooling radiator for heat dissipation. The water cooling radiator is noisy due to the need of a water pump, and presents a significant safety risk to associated equipment due to the use of water to dissipate heat. However, when the heat exchange system 100 for heat dissipation of the electronic control assembly according to the present disclosure is in use, the second end 2002 of the first heat exchange portion is not higher than the first end 2001 of the first heat exchange portion in the direction of gravity, the second end 3002 of the second heat exchange portion is lower than the first end 3001 of the second heat exchange portion in the direction of gravity, the third communication port is lower than the first communication port in the direction of gravity, and the fourth communication port is lower than the second communication port in the direction of gravity, so that the liquid refrigerant in the first heat exchange portion can flow into the second heat exchange portion through the second connection tube 5 by means of its own weight. Thus, by using a form of a gravity heat tube, elements such as the water pump are eliminated, and the noise is low. Furthermore, the first heat exchange portion and the second heat exchange portion are charged with the refrigerant, and once the system leaks, the refrigerant is discharged as a gas, thus reducing the safety risk of the short circuit of electronic elements.

In some embodiments, the first heat exchange portion is a first heat exchange assembly 2. The first heat exchange assembly 2 includes a first tube 21, a second tube 22 and a plurality of heat exchange tubes 23. The second tube 22 and the first tube 21 are spaced apart from each other, the first communication port is arranged at the first tube 21, and the second communication port is arranged at the second tube 22. The plurality of heat exchange tubes 23 are spaced apart from each other along a length direction of the first tube 21. At least one of the heat exchange tubes 23 is connected to the first tube 21 at one end in a length direction of the heat exchange tube 23, and each heat exchange tube 23 is connected to the second tube 22 at the other end in the length direction of the heat exchange tube 23, so as to communicate the first tube 21 with the second tube 22.

Figure 2:
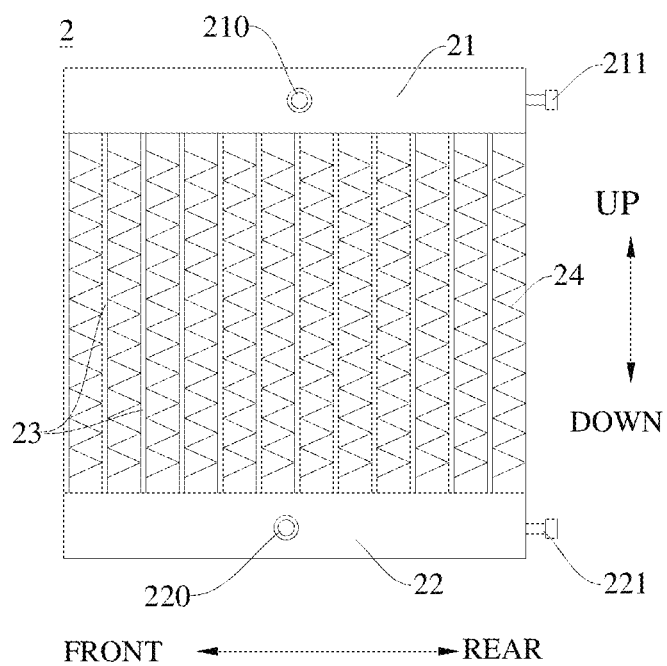
FIG. 2 is a schematic view of a first heat exchange assembly according to an embodiment of the present disclosure.

As shown in FIGS. 1 and 2, the second tube 22 and the first tube 21 each extend in a front-rear direction, i.e., the second tube 22 and the first tube 21 are arranged in parallel to each other. The second tube 22 and the first tube 21 are spaced apart in an up-down direction. The first tube 21 is provided with a port 210, the port 210 of the first tube is the first communication port, the second tube 22 is provided with a port 220, and the port 220 of the second tube is the second communication port. The plurality of heat exchange tubes 23 are spaced apart from each other in the front-rear direction, and the length direction of each heat exchange tube 23 is parallel to the up-down direction. Each heat exchange tube 23 is connected between the first tube 21 and the second tube 22 in the up-down direction, so as to communicate the first tube 21 with the second tube 22. It can be understood that the present disclosure is not limited to this. The first tube 21 and the second tube 22 may also be parallel to each other and inclined relative to the front-rear direction, or the first tube 21 may not be parallel to the second tube 22, i.e. the second tube 22 and/or the first tube 21 are inclined at an angle with respect to each other.

Figure 3:
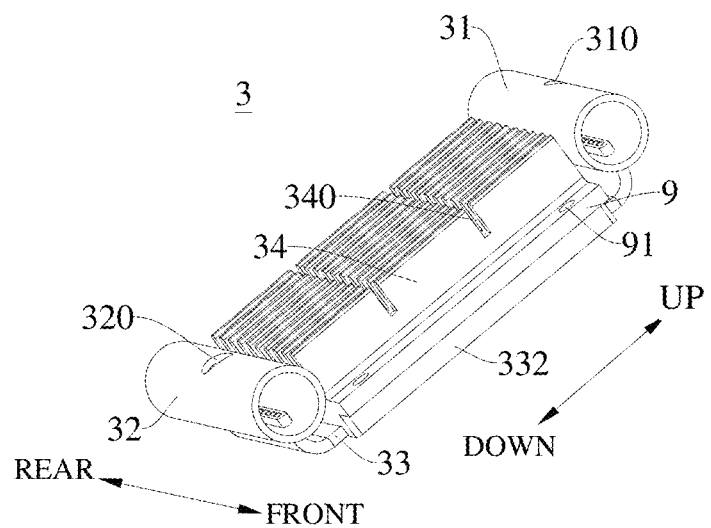
FIG. 3 is an exemplary schematic view of a second heat exchange assembly according to an embodiment of the present disclosure.

The second heat exchange portion is a second heat exchange assembly 3, and the second heat exchange assembly 3 includes a third tube 31, a heat exchange component 33 and a fourth tube 32. The fourth tube 32 and the third tube 31 are spaced apart from each other, the third communication port is arranged at the third tube 31, and the fourth communication port is arranged at the fourth tube 32. As shown in FIGS. 1 and 3, the second heat exchange assembly 3 is located on a right side of the first heat exchange assembly 2, and the fourth tube 32 and the third tube 31 each extend in the front-rear direction, i.e., the fourth tube 32 and the third tube 31 are arranged in parallel to each other. The fourth tube 32 and the third tube 31 are spaced apart from each other in the up-down direction. The third tube 31 is provided with a port 310, the port 310 of the third tube is the third communication port, the fourth tube 32 is provided with a port 320, and the port 320 of the fourth tube is the fourth communication port.

One end of two oppositely-arranged ends of the heat exchange component 33 is connected to the third tube 31, and the other end of the two oppositely-arranged ends of the heat exchange component 33 is connected to the fourth tube 32. In other words, the heat exchange component 33 is connected between the third tube 31 and the fourth tube 32. The heat exchange component 33 includes a plurality of channels, and each channel is in communication with the third tube 31 and the fourth tube 32. In other words, the third tube 31 is in communication with the fourth tube 32 through the channels of the heat exchange component 33. Specifically, the plurality of channels are spaced apart from each other along a length direction of the third tube 31. At least a part of the heat exchange component 33 may be in contact with the electronic control assembly 200, so as to exchange heat with the electronic control assembly 200, thereby realizing the heat dissipation of the electronic control assembly 200. The first end 4001 of the first connection tube is connected to the first tube 21 through the first communication port, and the second end 4002 of the first connection tube is connected to the third tube 31 through the third communication port, so as to communicate the first tube 21 with the third tube 31. The first end 5001 of the second connection tube is connected to the second tube 22 through the second communication port, and the second end 5002 of the second connection tube is connected to the fourth tube 32 through the fourth communication port, so as to communicate the second tube 22 with the fourth tube 32.

The heat exchange system 100 is mounted in an assembling unit during use. A junction of at least one heat exchange tube 23 to the second tube 21 is not higher than a junction of the at least one heat exchange tube 23 to the first tube 21 in the direction of gravity, and a communication point of at least one channel to the fourth tube 32 is lower than a communication point of the at least one channel to the third tube 31 in the direction of gravity. As shown in FIGS. 1 and 3, the first tube 21, the second tube 22, the third tube 31 and the fourth tube 32 each extend in the front-rear direction, the first tube 21 and the second tube 22 are located on the left side of the third tube 31 and the fourth tube 32, the first tube 21 is located above the second tube 22, the third tube 31 is located above the fourth tube 32, the first tube 21 is higher than the third tube 31, and the second tube 22 is higher than the fourth tube 32. An upper end of the heat exchange tube 23 is connected to the first tube 21, a lower end of the heat exchange tube 23 is connected to the second tube 22, an upper end of the heat exchange component 33 is connected to the third tube 31, and a lower end of the heat exchange component 33 is connected to the fourth tube 32. The plurality of channels of the heat exchange component 33 each penetrate through the heat exchange component 33 in the up-down direction, and the plurality of channels are spaced apart from each other in the front-rear direction. An upper end of each channel is in communication with the third tube 31 and a lower end of each channel is in communication with the fourth tube 32.

Therefore, the liquid refrigerant in the second heat exchange assembly 3 absorbs heat from the electronic control assembly 200 through at least a part of a surface of the heat exchange component 33, evaporates into the gaseous refrigerant and enters the first tube 21 in the first heat exchange assembly 2 through the third tube 31 of the second heat exchange assembly 3 and the first connection tube 4. In other words, the first connection tube 4 may guide the gaseous refrigerant in the second heat exchange assembly 3 into the first heat exchange assembly 2. The gaseous refrigerant in the first heat exchange assembly 2 condenses into the liquid refrigerant and enters the second tube 22. Since the second communication port of the second tube 22 in the first heat exchange assembly 2 is higher than the fourth communication port of the fourth tube 32 in the second heat exchange assembly 3, the liquid refrigerant in the first heat exchange assembly 2 can flow into the fourth communication port in the second heat exchange assembly 3 through the second communication port in the first heat exchange assembly 2 and the second connection tube 5 by means of its own weight. In other words, since a position of the second communication port is higher than a position of the fourth communication port, the liquid refrigerant in the second tube 22 can flow into the fourth communication port through the second communication port and the second connection tube 5 under the action of the liquid refrigerant's own weight, so as to enter the fourth tube 32. Therefore, the circulated heat exchange of the refrigerant is realized by using the principle of the gravity heat tube.

In the heat exchange system 100 for heat dissipation of the electronic control assembly according to the embodiments of the present disclosure, the first heat exchange assembly 2 and the second heat exchange assembly 3 are provided and in communication with each other, so that the first heat exchange assembly 2 serves as the condenser, and the second heat exchange assembly 3 serves as the heat dissipation module for the electronic control assembly 200. By adopting the separate first heat exchange assembly 2 and second heat exchange assembly 3 for heat dissipation of the electronic control assembly 200, the heat dissipation effect for the electronic control assembly 200 is improved, elements such as the water pump are eliminated, and the noise is low. Furthermore, the first heat exchange assembly 2 and second heat exchange assembly 3 are charged with the refrigerant, and once the system leaks, the refrigerant is discharged as a gas, thus reducing the safety risk of the short circuit of electronic elements.

The heat exchange system 100 for heat dissipation of the electronic control assembly according to the embodiments of the present disclosure is a circulating system, and the refrigerant circulates between the first heat exchange assembly 2 and the second heat exchange assembly 3. The first tube 21 in the first heat exchange assembly 2 further has a first port 211, the first port 211 is an opening, the second tube 22 further has a second port 221, and the second port 221 is another opening. The first port 211 and the second port 221 are normally closed, and are opened only when the refrigerant is charged or discharged.

In some embodiments, the heat exchange system 100 for heat dissipation of the electronic control assembly further includes a fan 1, the first heat exchange assembly 2 is arranged adjacent to the fan 1, and an air outlet of the fan 1 is opposite to a windward side of the first heat exchange assembly 2. As shown in FIG. 1, the first heat exchange assembly 2 is adjacent to the fan 1 and located on a right side of the fan 1, the fan 1 has an air outlet, the first heat exchange assembly 2 has a windward side and a leeward side, and the windward side of the first heat exchange assembly 2 is opposite to the air outlet of the fan 1, so that the wind blown out by the fan 1 through the air outlet may enter the first heat exchange assembly 2. The fan 1 may further be replaced by a blower. Therefore, under the action of the fan 1, the gaseous refrigerant in the first heat exchange assembly 2 may be accelerated to liquefy into the liquid refrigerant, thus improving the heat exchange performance of the first heat exchange portion and improving the heat exchange effect of the system.

In some embodiments, the first heat exchange assembly 2 further includes a first fin 24 arranged between adjacent heat exchange tubes 23. By providing the first fin 24, a heat exchange area between two adjacent heat exchange tubes 23 can be increased, and the heat exchange efficiency of the first heat exchange assembly 2 can be improved. Further, the heat exchange tube 23 is a flat tube. The flat tube includes a first side face and a second side face oppositely arranged in a thickness direction of the flat tube, the flat tube further includes a third side face and a fourth side face oppositely arranged in a width direction of the flat tube, and a distance between the first side face and the second side face of the flat tube is smaller than a distance between the third side face and the fourth side face of the flat tube. The thickness direction of the heat exchange tube 23 is substantially parallel to the length direction of the third tube 31. Thus, the first heat exchange assembly 2 is a micro-channel heat exchanger, and the micro-channel heat exchanger has a relatively compact structure and a high heat exchange efficiency, thereby improving the heat exchange efficiency while further reducing the volume of the overall system.

Figure 16:
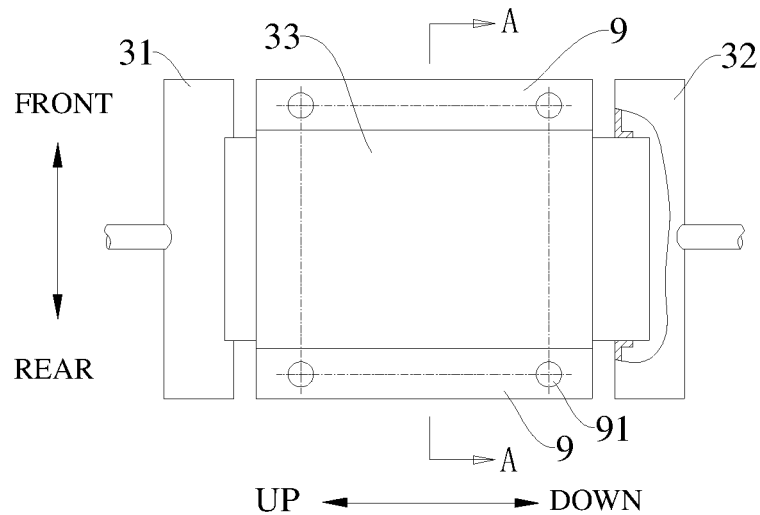
FIG. 16 is still another exemplary view of a second heat exchange assembly according to an embodiment of the present disclosure.
Figure 17:
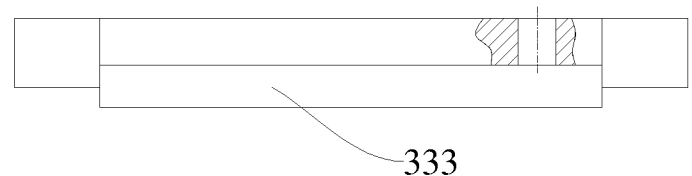
FIG. 17 is a top view of the second heat exchange assembly in FIG. 16.
Figure 20:
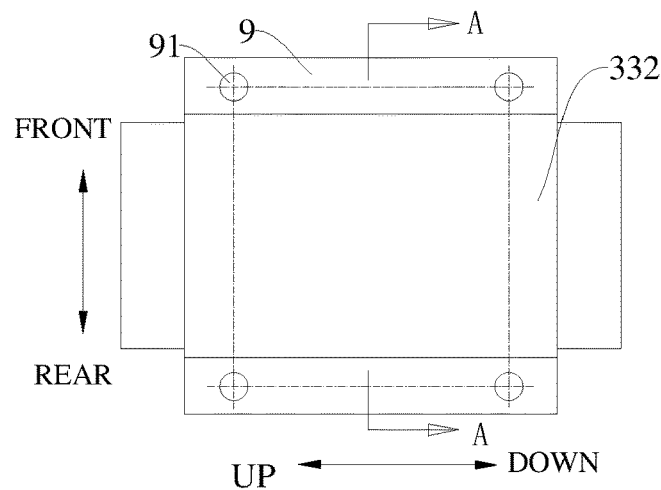
FIG. 20 is still another exemplary view of a second heat exchange assembly according to an embodiment of the present disclosure.
Figure 26:
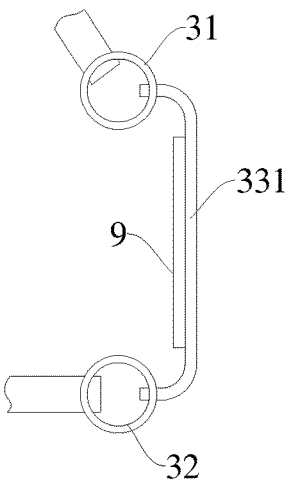
FIG. 26 is yet another exemplary view of a second heat exchange assembly according to an embodiment of the present disclosure.
Figure 27:
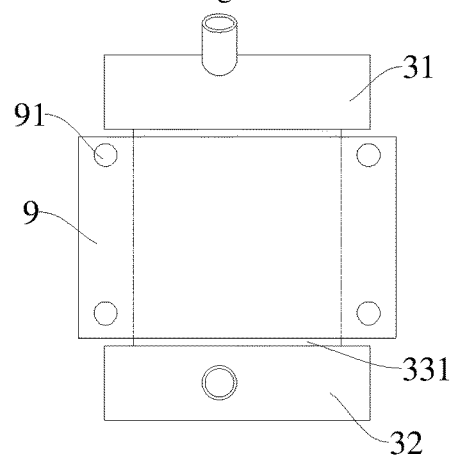
FIG. 27 is a side view of the second heat exchange assembly in FIG. 26.
Figure 28:
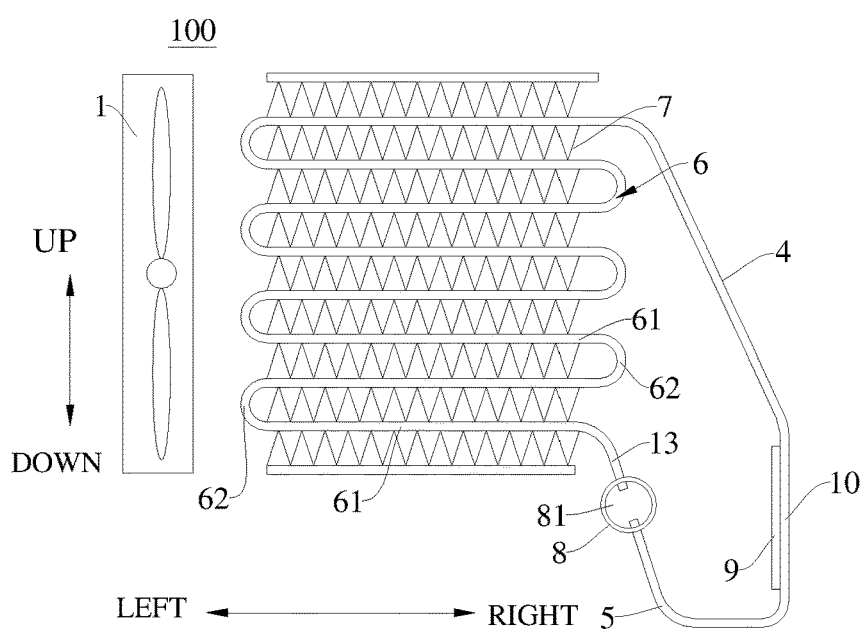
FIG. 28 is a schematic view of a heat exchange system for heat dissipation of an electronic control assembly according to still another embodiment of the present disclosure.

In some embodiments, the heat exchange system 100 for heat dissipation of the electronic control assembly according to the embodiments of the present disclosure further includes a fixing portion 9 connected to the heat exchange component 33. The fixing portion 9 has a mounting hole 91, and the heat exchange system 100 may fix the at least part of the surface of the heat exchange component 33 with the electronic control assembly 200 by a fastener penetrating through the mounting hole 91. It will be understood that the fixing portion 9 may be a fixing block as shown in FIGS. 3, 16 and 20, or may also be a fixing plate as shown in FIGS. 26 to 28. The fastener may include a bolt and a nut.

In some embodiments, the heat exchange component 33 includes a first flat tube 331. The first flat tube 331 includes a first side face and a second side face, and the first side face and the second side face of the first flat tube 331 are oppositely arranged in a thickness direction of the first flat tube 331. The first flat tube 331 further includes a third side face and a fourth side face, and the third side face and the fourth side face of the first flat tube 331 are oppositely arranged in a width direction of the first flat tube 331. A distance between the first side face and the second side face of the first flat tube 331 is less than a distance between the third side face and the fourth side face of the first flat tube 331.

One end of two ends of the first flat tube 331 oppositely arranged in a length direction of the first flat tube 331 is connected to the third tube 31, and the other end of the two ends of the first flat tube 331 oppositely arranged in the length direction of the first flat tube 331 is connected to the fourth tube 32. The first flat tube 331 includes a plurality of first channels 3310 spaced apart from each other in the width direction of the first flat tube 331, and the first channel 3310 is the channel of the heat exchange component 33. Specifically, the first channel 3310 penetrates through the first flat tube 331 along the length direction of the first flat tube 331. When the heat exchange system 100 is in use, a junction of at least one first flat tube 331 to the fourth tube 32 is lower than a junction of the at least one first flat tube 331 to the third tube 31 in the direction of gravity.

As shown in FIGS. 3, 4 and FIGS. 6 to 27, the length direction of the first flat tube 331 is the up-down direction, an upper end of the first flat tube 331 is connected to the third tube 31, and a lower end of the first flat tube 331 is connected to the fourth tube 32. The first flat tube 331 includes the plurality of first channels 3310 penetrating through the first flat tube 331 in the up-down direction, an upper end of the first channel 3310 is in communication with the third tube 31, and a lower end of the first channel 3310 is in communication with the fourth tube 32. In other words, the first channel 3310 serves as the channel of the heat exchange component 33, so as to communicate the third tube 31 with the fourth tube 32.

In some alternative embodiments, one side face of the first side face or the second side face of the first flat tube 331 is in contact with the electronic control assembly 200. In other words, one side face of the two side faces of the first flat tube 331 oppositely arranged in the thickness direction of the first flat tube 331 is in contact with the electronic control assembly 200. As shown in FIGS. 1 to 4, the thickness direction of the first flat tube 331 is parallel to the left-right direction, the first flat tube 331 includes a left side face and a right side face oppositely arranged in the left-right direction, and the right side face of the first flat tube 331 is in contact with the electronic control assembly 200.

Specifically, the width direction of the first flat tube 331 is substantially parallel to the length direction of the third tube 31. As shown in FIGS. 1 to 4, the length direction of the third tube 31 is the front-rear direction, and the width direction of the first flat tube 331 is parallel to the front-rear direction. One or more first flat tubes 331 may be provided. When one first flat tube 331 is provided, a width of this first flat tube 331 is relatively large to be adapted to a size of the electronic control assembly 200, and the width of the first flat tube 331 is less than a length of the third tube 31 and a length of the fourth tube 32, so that two ends of the first flat tube 331 can be inserted into the third tube 31 and the fourth tube 32, respectively. When a plurality of first flat tubes 331 are provided, the plurality of first flat tubes 331 are arranged in the length direction of the third tube 31. One side face of the two side faces of each of the plurality of first flat tubes 331 in the thickness direction of the first flat tube 331 is in contact with the electronic control assembly 200. The one first flat tube 331 or the plurality of first flat tubes 331 are in contact with the electronic control assembly 200, thus increasing the heat exchange area and improving the amount of heat exchange.

In other alternative embodiments, the heat exchange component 33 further includes a first component 332 to which the first flat tube 331 is mounted. The first component 332 includes a first side face and a second side face arranged opposite to each other, and the first side face of the first component 332 may be in contact with the electronic control assembly 200. In other words, in this embodiment, one side face of the first side face or the second side face of the first flat tube 331 is no longer in contact with the electronic control assembly 200, but is instead in contact with the electronic control assembly 200 through the first component 332.

Optionally, the first component 332 has a through hole, and the first flat tube 331 is arranged to the first component 332 through the through hole. In other words, the first flat tube 331 penetrates through the first component 332 through the through hole. It can be understood that a manner in which the first flat tube 331 is arranged to the first component 332 in the present disclosure is not limited to the through hole, but may also be a slot hole. For example, the first component 332 has a third slot hole including an open end and a closed end. The open end of the third slot hole is arranged in the second side face of the first component 332, a connection portion is arranged between the closed end of the third slot hole and the first side face of the first component 332, and the first flat tube 331 is fitted and arranged in the third slot hole so as to be in contact with the first component 332. The third slot hole includes a bottom face and a side wall face, the first side face or the second side face of the first flat tube 331 is in contact with the bottom face of the third slot hole, and at least one side face of the third side face or the fourth side face of the first flat tube 331 is in contact with the third slot hole. In other words, the first flat tube 331 penetrates through the first component 332 through the third slot hole.

It can be understood that when one first flat tube 331 is provided, the first component 332 may have one through hole or one third slot hole. When a plurality of first flat tubes 331 are provided, the first component 332 may have one or more through holes or have one or more third slot holes. When the first component 332 has one through hole or one third slot hole, the plurality of first flat tubes 331 all pass through this through hole or this third slot hole. When the first component 332 has a plurality of through holes or a plurality of third slot holes, the plurality of through holes or the plurality of third slot holes are arranged in the length direction of the third tube 31, and the plurality of first flat tubes 331 pass through the plurality of through holes or the plurality of third slot holes correspondingly and respectively. Further, in the embodiment in which one side face of the first side face or the second side face of the first flat tube 331 is in contact with the electronic control assembly 200, the heat exchange component 33 may also include the first component 332.

The first component 332 has a fourth slot hole including an open end and a closed end. The open end of the fourth slot hole is arranged in the first side face of the first component 332, a connection portion is arranged between the closed end of the fourth slot hole and the second side face of the first component 332, and the first flat tube 331 is fitted and arranged in the fourth slot hole so as to be in contact with the first component 332. The fourth slot hole includes a bottom face and a side wall face, and the other side face of the first side face or the second side face of the first flat tube 331 is attached to the bottom face of the fourth slot hole, so that one side face of the first side face or the second side face of the first flat tube 331 is exposed to be in contact with the electronic control assembly 200.

Figure 4:
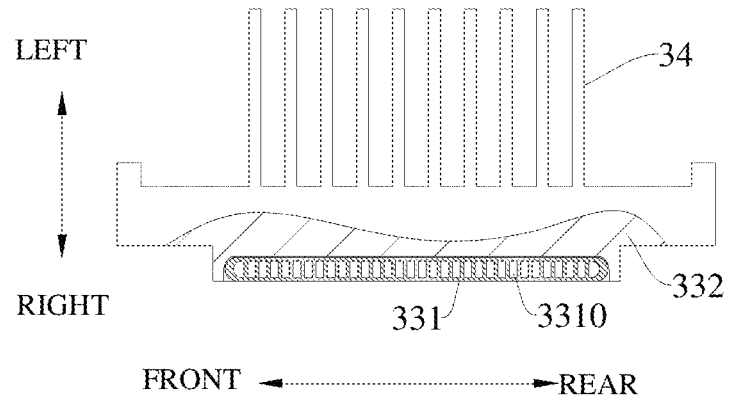
FIG. 4 is a sectional view of a second heat exchange assembly in FIG. 1 along A-A.

Specifically, one side face of the first side face or the second side face of the first flat tube 331 protrudes out of the fourth slot hole or is flush with the first side face of the first component 332, so that the above one side face of the first side face or the second side face of the first flat tube 331 is in contact with the electronic control assembly 200. As shown in FIGS. 3 and 4, the fourth slot hole is arranged in a right side face of the first component 332, and the right side face of the first flat tube 331 is in contact with the electronic control assembly 200.

Further, a plurality of protrusion portions 34 are arranged on the second side face of the first component 332 and spaced apart from each other along the length of the third tube 31, and a thickness direction of the protrusion portion 34 is substantially parallel to the length direction of the third tube 31. The protrusion portion 34 includes two side faces in a width direction of the protrusion portion 34, and one side face of the two side faces of the protrusion portion 34 is connected to the second side face of the first component 332. The protrusion portion 34 has at least one fifth slot hole 340 including an open end and a closed end, and the open end of the fifth slot hole 340 is arranged in the other side face of the two side faces of the protrusion portion 34. A connection portion is arranged between the closed end of the fifth slot hole 340 and the above one side face of the two side faces of the protrusion portion 34.

As shown in FIGS. 3 and 4, the plurality of protrusion portions 34 are arranged on a left side face of the first component 332, and a distance is defined between any two adjacent protrusion portions 34 of the plurality of protrusion portions 34 in the front-rear direction. A thickness direction of the protrusion portion 34 is the front-rear direction, a width direction of the protrusion portion 34 is the left-right direction, and a length direction of the protrusion portion 34 is the up-down direction. The protrusion portion 34 includes a left side face and a right side face, and the fifth slot hole extending rightwards to a depth less than a width of the protrusion portion 34 is arranged in the left side face of the protrusion portion 34. The fifth slot hole 340 penetrates through the protrusion portion 34 in the thickness direction of the protrusion portion 34 (the front-rear direction), and the right side face of the protrusion portion 34 is connected to the left side face of the first component 332. The protrusion portion 34 can further increase the heat dissipation to the electronic control assembly 200, and the heat generated by the electronic control assembly 200 can be dissipated through the protrusion portion 34, in addition to being conducted to the refrigerant.

Further, as shown in FIG. 3, the first component 332 includes a front side face and a rear side face oppositely arranged in the front-rear direction, a fixing block is arranged to each of the front side face and the rear side face of the first component 332, the fixing block serves as the fixing portion 9, and each fixing block has a plurality of mounting holes 91 spaced apart from each other along the up-down direction. A fastener may penetrate through each mounting hole 91 correspondingly. In other words, the first component 332 may be fixed to a surface of the electronic control assembly 200 through the fastener and the mounting hole 91. The fixing block may be integrally formed with the first component 332. It can be understood that the first component 332 or the first flat tube 331 may be in direct or indirect contact with the surface of the electronic control assembly 200. The indirect contact means that in some applications, the electronic control assembly 200 is connected to the first component 332 or the first flat tube 331 by a thermally conductive adhesive. In other applications, the indirect contact means that the electronic control assembly 200 is mounted to another component, such as a mounting member, through which the electronic control assembly 200 is in contact with the first component 332 or the first flat tube 331, so as to conduct the heat.

The present disclosure is not limited to this. For example, in some other optional embodiments, the plurality of first flat tubes 331 are provided, the heat exchange component 33 further includes the first component 332, the plurality of first flat tubes 331 are mounted to the first component 332, and the plurality of first flat tubes 331 are spaced apart from each other along the length direction of the third tube 31. The thickness direction of each first flat tube 331 is parallel to the length direction of the third tube 31, or an included angle between the thickness direction of the first flat tube 331 and the length direction of the third tube 31 is greater than 0° and less than 90°. As shown in FIGS. 7 to 9 and FIGS. 11 to 15, the thickness direction of the first flat tube 331 and the length direction of the third tube 31 are each parallel to the front-rear direction. As shown in FIG. 10, the length direction of the third tube 31 is parallel to the front-rear direction, the thickness direction of the first flat tube 331 is inclined at an angle relative to the front-rear direction, i.e., defining an included angle with the front-rear direction, and the included angle is greater than 0° and less than 90°. In other words, a first slot hole 3320 in the first component 332 is a chute in which the first flat tube 331 is inserted, so as to reduce a diameter of the third tube 31 or a diameter of the fourth tube 32 and increase a width of the first flat tube 331.

Specifically, the first component 332 includes the first side face and the second side face arranged opposite to each other, the first side face of the first component 332 may be in contact with the electronic control assembly 200, and the first flat tube 331 penetrates through the first component 332 along the length direction of the first flat tube 331. As shown in FIGS. 6 to 15, the heat exchange component 33 includes the plurality of first flat tubes 331 spaced apart from each other in the front-rear direction. The first component 332 has a plurality of grooves or through holes so that the plurality of first flat tubes 331 penetrate through the first component 332 in the length direction of the first flat tube 331. Thus, one end of the first flat tube 331 in the length direction is connected to the third tube 31 and the other end of the first flat tube 331 in the length direction is connected to the fourth tube 32. The first component 332 includes a left side face and a right side face oppositely arranged in the left-right direction, and one side face of the first component 332 away from the first heat exchange assembly 2 in the left-right direction, i.e. the right side face of the first component 332, may be in contact with the electronic control assembly 200.

Further, the first component 332 has a plurality of first slot holes 3320 penetrating through the first component 332, and the first slot hole 3320 includes an open end and a closed end. The open end of the first slot hole 3320 is arranged in the second side face of the first component 332, and a connection portion is arranged between the closed end of the first slot hole 3320 and the first side face of the first component 332. The plurality of first slot holes 3320 are spaced apart from each other along the length direction of the third tube 31, and the first flat tube 331 is fitted and arranged in the first slot hole 3320, so as to be in contact with the first component 332. The first slot hole 3320 includes a bottom face and a side wall face, at least one side face of the two side faces (at least one side face of the third side face or the fourth side face) of the first flat tube 331 in the thickness direction of the first flat tube 331 is attached to the side wall face of the first slot hole 3320, and one side face of the two side faces (one side face of the first side face or the second side face) of the first flat tube 331 in the width direction of the first flat tube 331 is attached to the bottom face of the first slot hole 3320.

As shown in FIGS. 7 to 9 and FIGS. 11 to 14, the plurality of first slot holes 3320 are arranged in the left side face of the first component 332, i.e. an opening of the first slot hole 3320 is in the left side face of the first component 332. The first slot hole 3320 includes the bottom face opposite to the opening and a front wall face and a rear wall face oppositely arranged in the front-rear direction. A size of each first slot hole 3320 in the left-right direction is smaller than a size of the first component 332 in the left-right direction. The first slot hole 3320 penetrates through the first component 332 in the up-down direction, the plurality of first slot holes 3320 are spaced apart from each other in the front-rear direction, one first flat tube 331 passes through each first slot hole 3320 correspondingly so as to penetrate through the first component 332, and the bottom face of the first slot hole 3320 is connected to the right side face of the first flat tube 331. Moreover, the front wall face of the first slot hole 3320 is attached to a front side face of the first flat tube 331, and/or the rear wall face of the first slot hole 3320 is attached to a rear side face of the first flat tube 331. Thus, by inserting the plurality of first flat tubes 331 in the plurality of first slot holes 3320 of the first component 332 and welding the plurality of first flat tubes 331 with the first component 332, the contact area of the electronic control assembly 200 with the second heat exchange assembly 3 can be increased.

Figure 11:
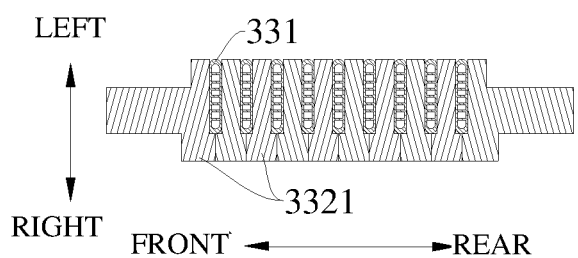
FIG. 11 is still another exemplary sectional view of the heat exchange component in FIG. 6 along A-A.

In some specific embodiments, the first component 332 is formed by a plurality of first blocks 3321 spliced together, a thickness direction of the first block 3321 is substantially parallel to the length direction of the third tube 31, and the plurality of first blocks 3321 are arranged sequentially in the length direction of the third tube 31. As shown in FIG. 11, the thickness direction of the first block 3321 is the front-rear direction, the plurality of first blocks 3321 are sequentially arranged in the front-rear direction, and the first slot hole 3320 is formed between two adjacent first blocks 3321.

Optionally, a surface of one first block of the two adjacent first blocks 3321 adjacent to the other first block of the two adjacent first blocks 3321 is stepped and includes a first step face, a second step face, and a connecting face connecting the first step face to the second step face. A surface of the other first block adjacent to the one first block is stepped and includes a first step face, a second step face, and a connecting face connecting the first step face to the second step face. The first step face of the one first block is connected to the first step face of the other first block, the first slot hole 3320 is formed between the second step face of the one first block and the second step face of the other first block, and one side face of the two side faces of the first flat tube 331 oppositely arranged in the width direction of the first flat tube 331 is connected to the first step face and the second step face.

As shown in FIG. 11, in two first blocks arranged sequentially and adjacently from front to rear, a rear surface of the front first block is opposed to and partially connected to a front surface of the rear first block. The rear surface of the front first block and the front surface of the rear first block are each stepped and each include a first step face, a connecting face and a second step face arranged sequentially from left to right. The first step face and the second step face are spaced apart from each other in the front-rear direction and are connected through the connecting face, the first step face of the front first block is located in front of the second step face of the front first block, and the first step face of the rear first block is located behind the second step face of the rear first block, so that the first slot hole 3320 is defined between the first step face of the front first block and the first step face of the rear first block. Moreover, the second step face of the front first block is connected to the second step face of the rear first block. Specifically, the second step face of the front first block and the second step face of the rear first block are welded to each other. The right side face of the first flat tube 331 is in contact with the second step face of the front first block and the second step face of the rear first block. In other words, the first component 332 is a combined member and formed by a plurality of small first blocks 3321 spliced together. The first flat tube 331 is sandwiched and welded between the two adjacent first blocks 3321, and the first flat tube 331 may be in close contact with the first block 3321 during welding, so as to facilitate the welding therebetween.

In some other specific embodiments, the first component 332 includes a second block 3322 and a plurality of third blocks 3323, and the plurality of third blocks 3323 are spaced apart from each other along the length direction of the third tube 31. The second block 3322 includes a first surface and a second surface opposite to each other, the first surface of the second block 3322 is the first side face of the first component 332, and a second slot hole 33220 is arranged in the second surface of the second block 3322. The plurality of third blocks 3323 are fitted and arranged in the second slot hole 33220, and a plurality of protrusions 33221 are arranged on a bottom of the second slot hole 33220. The plurality of protrusions 33221 are spaced apart from each other in a width direction of the second block 3322, the protrusion 33221 is located between adjacent third blocks 3321, and one side face of the two side faces of the first flat tube 331 oppositely arranged in the width direction of the first flat tube 331 is connected to the protrusion 33221.

Figure 12:
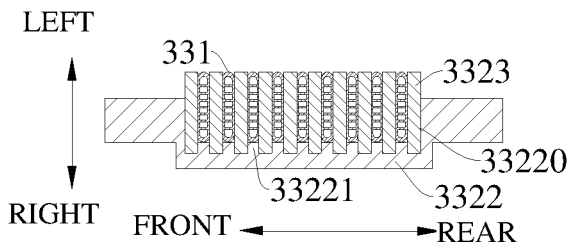
FIG. 12 is still another exemplary sectional view of the heat exchange component in FIG. 6 along A-A.

As shown in FIG. 12, the second block 3322 includes a left side face and a right side face oppositely arranged in the left-right direction, the right side face of the second block 3322 may be in contact with the electronic control assembly 200, and the second slot hole 33220 is arranged in the left side face of the second block 3322. The plurality of third blocks 3323 are spaced apart from each other in the front-rear direction and arranged in the second slot hole 33220, and the first slot hole 3320 is defined between adjacent third blocks 3323. The plurality of protrusions 33221 spaced apart from each other along the length direction of the third tube 31 are arranged on the bottom of the second slot hole 33220, one protrusion 33221 is arranged between each two adjacent third blocks 3323, and the right side face of the first flat tube 331 is connected to an upper surface of the protrusion 33221. In other words, the second block 3322 has a slot, the plurality of third blocks 3323 are inserted into the slot side by side, and the first flat tube 331 is inserted and welded between two adjacent third blocks 3323. Moreover, the plurality of third blocks 3323 are welded to the second block 3322.

Optionally, the third block 3323 includes two side faces opposite to each other, one side face of the two side faces of the third block 3323 is in contact with a bottom face of the second slot hole 33220, and the other side face of the two side faces of the third block 3323 is outside the second slot hole 33220. As shown in FIG. 12, a thickness direction of the third block 3323 is the front-rear direction, and the plurality of third blocks 3323 are spaced apart from each other along the front-rear direction. A width direction of the third block 3323 is the left-right direction, the third block 3323 includes a left side face and a right side face opposite to each other, the right side face of the third block 3323 is in contact with the bottom face of the second slot hole 33220, and the left side face of the third block 3323 is located outside the second slot hole 33220, i.e., the left side face of the third block 3323 is located on a left side of the left side face of the second block 3322.

Figure 13:
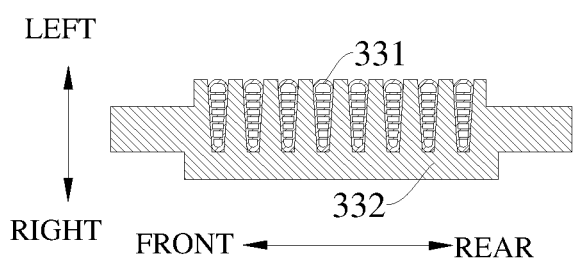
FIG. 13 is yet another exemplary sectional view of the heat exchange component in FIG. 6 along A-A.
Figure 14:
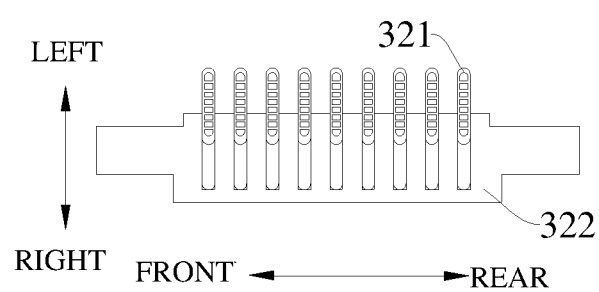
FIG. 14 is still another exemplary view of a heat exchange component according to an embodiment of the present disclosure.

In the above embodiment shown in FIGS. 11 to 13, the first flat tube 331 can be more easily placed into the first slot hole 3320.

Figure 9:
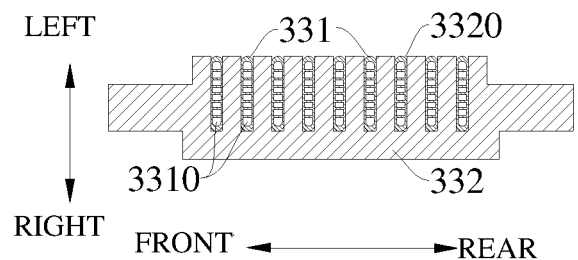
FIG. 9 is an exemplary sectional view of the heat exchange component in FIG. 6 along A-A.
Figure 10:
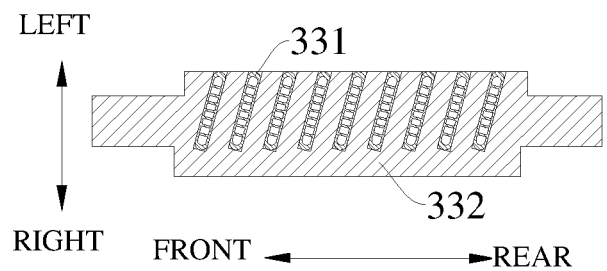
FIG. 10 is another exemplary sectional view of the heat exchange component in FIG. 6 along A-A.

In some specific embodiments, a thickness of the first flat tube 331 remains constant in the width direction of the first flat tube 331, and a size of the first slot hole 3320 in the length direction of the third tube 31 remains constant in a direction from the first side face of the first component 332 toward the second side face of the first component 332, as shown in FIGS. 9, 11 and 12. Alternatively, the thickness of the first flat tube 331 gradually increases in the width direction of the first flat tube 331, and the size of the first slot hole 3320 in the length direction of the third tube 31 gradually increases in the direction from the first side face of the first component 332 toward the second side face of the first component 332, as shown in FIG. 13.

In some embodiments, the first flat tube 331 includes a first section 3311, a first curved section 3314, a middle section 3313, a second curved section 3315 and a second section 3312 along the length direction of the first flat tube 331. One end of the first section 3311 in a length direction of the first section 3311 is connected to the third tube 31, the other end of the first section 3311 in the length direction of the first section 3311 is connected to one end of the middle section 3313 in a length direction of the middle section 3313 through the first curved section 3314, the other end of the middle section 3313 in the length direction of the middle section 3313 is connected to one end of the second section 3312 in a length direction of the second section 3312 through the second curved section 3315, and the other end of the second section 3312 in the length direction of the second section 3312 is connected to the fourth tube 32. A first side face of the first section 3311 has a first side edge extending in the length direction of the first section 3311, a first side face of the middle section 3313 has a middle side edge extending in the length direction of the middle section 3313, and a first side face of the second section 3312 has a second side edge extending in the length direction of the second section 3312. The first side edge and the middle side edge are angled.

Figure 15:
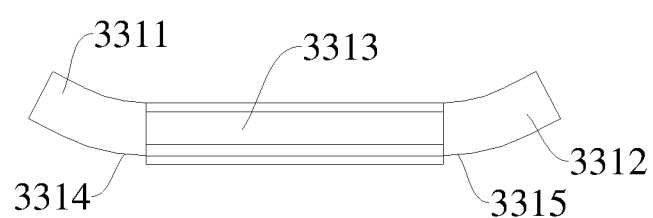
FIG. 15 is a schematic view of a first flat tube in FIG. 14.

As shown in FIG. 15, the first flat tube 331 includes the first section 3311, the middle section 3313 and the second section 3312 sequentially from up to down, the first section 3311 is connected to the third tube 31, and the second section 3312 is connected to the fourth tube 32. The first curved section 3314 connects the first section 3311 to the middle section 3313, and the second curved section 3315 connects the middle section 3313 to the second section 3312. In other words, two ends of the first flat tube 331 in the length direction of the first flat tube 331 are bent by a certain angle, so that the first flat tube 331 or the first component 332 may be closer to the electronic control assembly 200, while the third tube 31 or the fourth tube 32 will not come into contact with the electronic control assembly 200, so as to decrease the mounting area and also reduce the influence of the leakage of the refrigerant on the electronic control assembly 200, thus improving the safety. It can be understood that the present disclosure is not limited to the manner in which the heat exchange component 33 communicates the third tube 31 with the fourth tube 32 through the first flat tube 331. For example, in some embodiments, the heat exchange component 33 includes a second component 333, one end of two opposite ends of the second component 333 is connected to the third tube 31, and the other end of the two opposite ends of the second component 333 is connected to the fourth tube 32.

The second component 333 includes a plurality of second channels 3330, and the second channel 3330 is the channel of the heat exchange component 33. The second channel 3330 communicates the third tube 31 with the fourth tube 32. In other words, the second channel 3330 penetrates through the second component 333, so as to communicate the third tube 31 with the fourth tube 32. At least a part of a surface of the second component 333 may be in contact with the electronic control assembly 200. When the heat exchange system 100 is in use, a communication point of at least one second channel 3330 to the fourth tube 32 is lower than a communication point of the at least one second channel 3330 to the third tube 31 in the direction of gravity.

As shown in FIGS. 16 to 19, the third tube 31 and the fourth tube 32 are directly connected to each other through the second component 333, and one side face of two side faces of the second component 33 oppositely arranged in the left-right direction may be in contact with the electronic control assembly 200. The plurality of second channels 3330 are arranged in the second component 333, and each second channel 3330 penetrates through the second component 333, so that one end of the second channel 3330 is in communication with the third tube 31 and the other end of the second channel 3330 is in communication with the fourth tube 32. In other words, the second channel 3330 serves as the channel of the heat exchange component 33, so as to communicate the third tube 31 with the fourth tube 32.

Specifically, as shown in FIG. 16, a size of an upper end of the second component 333 in the front-rear direction and a size of a lower end of the second component 333 in the front-rear direction, are smaller than a size of a rest part of the second component 333. The upper end of the second component 333 is inserted in the third tube 31, and the lower end of the second component 333 is inserted in the fourth tube 32.

Further, as shown in FIG. 16, the second component 333 includes a front side face and a rear side face oppositely arranged in the front-rear direction, a fixing block is arranged to each of the front side face and the rear side face of the second component 333, and the fixing block is a fixing portion 9. The fixing block has a plurality of mounting holes 91 spaced apart from each other in the up-down direction, and a fastener may penetrate through each mounting hole 91 correspondingly. In other words, one side face of the two oppositely-arranged side faces of the second component 333 may be fixed to the surface of the electronic control assembly 200 by the fastener and the mounting hole 91. The fixing block may be integrally formed with the second component 333.

Figure 18:
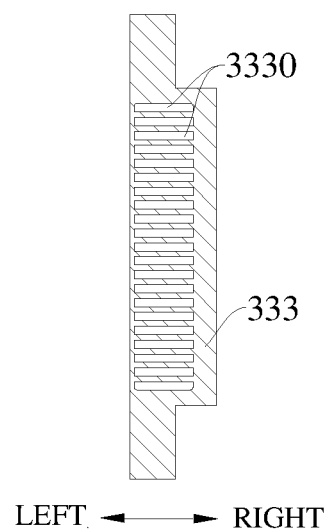
FIG. 18 is an exemplary sectional view of a heat exchange component in FIG. 16 along A-A.

In some embodiments, the second channel 3330 has a length and a width, a length direction of the second channel 3330 is substantially perpendicular to the length direction of the third tube 31, and the width of the second channel 3330 is not greater than the diameter of the third tube 31 or the diameter of the fourth tube 32. As shown in FIG. 18, the length direction of the second channel 3330 is parallel to the up-down direction, a width direction of the second channel 3330 is parallel to the left-right direction, and the width of the second channel 3330 is less than or equal to the diameter of the third tube 31 or the diameter of the fourth tube 32.

Figure 19:
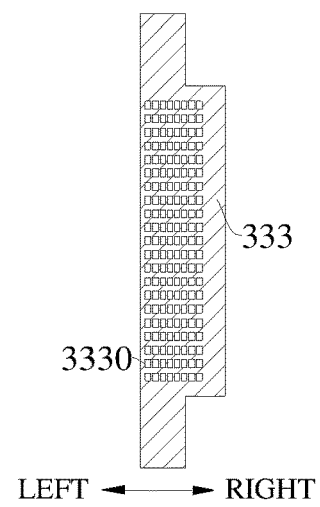
FIG. 19 is another exemplary sectional view of the heat exchange component in FIG. 16 along A-A.

In some specific embodiments, the plurality of second channels 3330 are divided into a plurality of groups spaced apart from each other along the length direction of the third tube 31, and the second channels 3330 in each group are spaced apart from each other. As shown in FIG. 19, the second channels 3330 are arranged in the plurality of groups spaced apart from each other in the front-rear direction, and the second channels 3330 in each group are spaced apart in the left-right direction.

The present disclosure is not limited to this. For example, the plurality of second channels 3330 are spaced apart from each other along the length direction of the third tube 31, and each second channel 3330 includes a plurality of sub-channels spaced apart from each other along the width direction of the second channel 3330. As shown in FIG. 19, the plurality of second channels 3330 are spaced apart from each other in the front-rear direction, and each second channel 3330 includes the plurality of sub-channels spaced apart from each other in the left-right direction.

Figure 5:
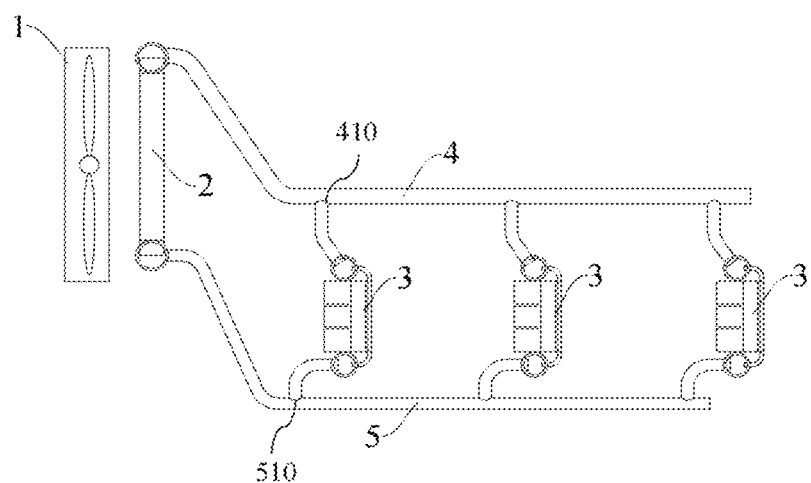
FIG. 5 is a schematic view of a heat exchange system for heat dissipation of an electronic control assembly according to another embodiment of the present disclosure.
Figure 6:
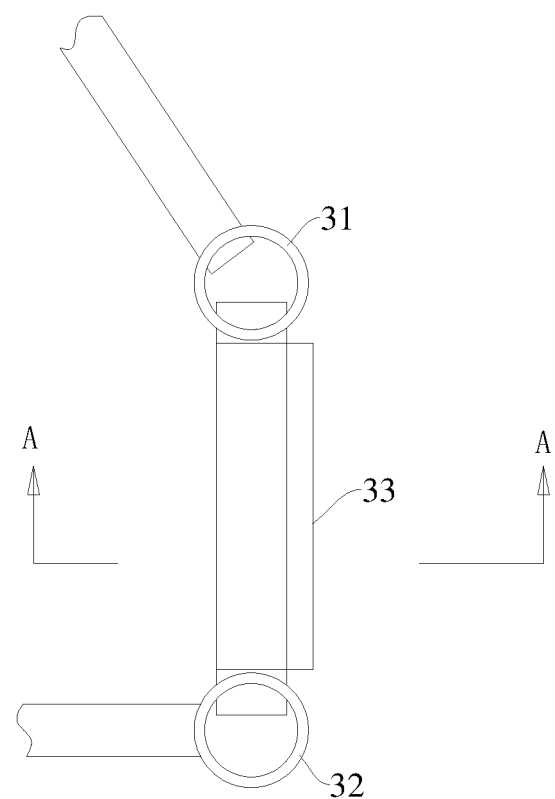
FIG. 6 is another exemplary schematic view of a second heat exchange assembly according to an embodiment of the present disclosure.
Figure 7:
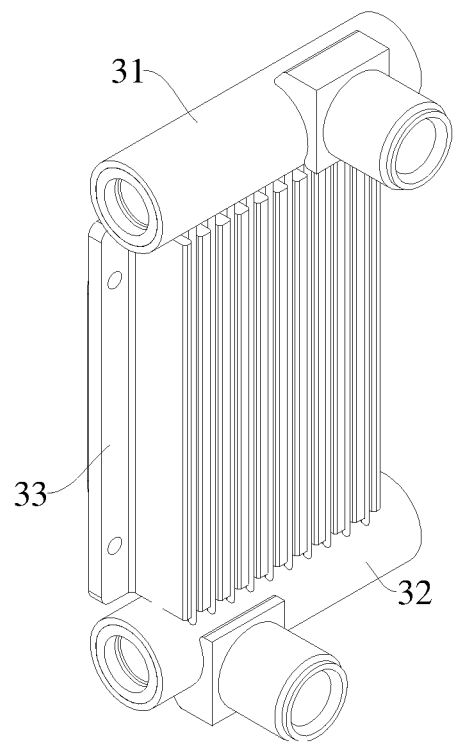
FIG. 7 is an exemplary schematic view of the second heat exchange assembly in FIG. 6.
Figure 8:
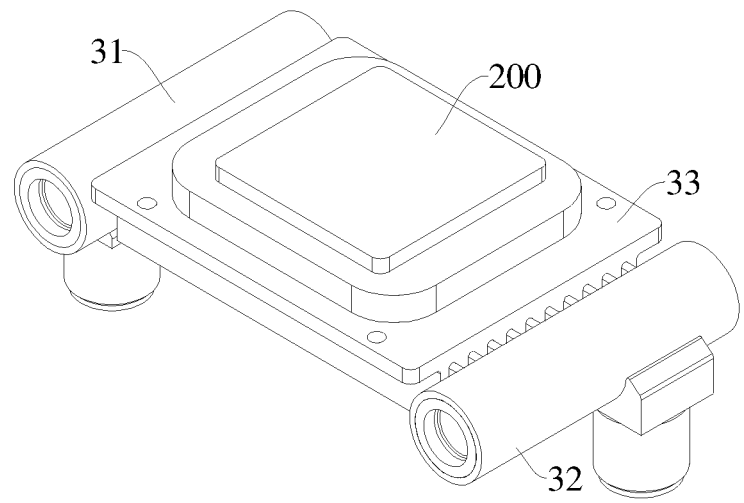
FIG. 8 is a schematic view of the second heat exchange assembly in FIG. 7 from another perspective.

In some embodiments, a plurality of second heat exchange assemblies 3 are provided, and the plurality of second heat exchange assemblies 3 are connected in parallel between the first connection tube 4 and the second connection tube 5. As shown in FIG. 5, the plurality of second heat exchange assemblies 3 are arranged sequentially and spaced apart from left to right, and each second heat exchange assembly 3 may dissipate the heat from the electronic control assembly 200. The third tube 31 of each second heat exchange assembly 3 is connected to the first connection tube 4 through a first segment of connection tube, and the fourth tube 32 of each second heat exchange assembly 3 is connected to the second connection tube 5 through a second segment of connection tube. A plurality of the first segments of connection tubes are provided, and the plurality of the first segments of connection tubes are arranged sequentially and spaced apart from left to right, and correspondingly communicate with the third tubes 31 of the plurality of second heat exchange assemblies 3. A plurality of the second segments of connection tubes are provided, and the plurality of the second segments of connection tubes are arranged sequentially and spaced apart from left to right, and correspondingly communicate with the fourth tubes 32 of the plurality of second heat exchange assemblies 3.

In other words, one first heat exchange assembly 2 (the condenser) carries the plurality of second heat exchange assemblies 3 (the heat dissipation modules for the electronic control assembly 200), and the respective second heat exchange assemblies 3 are connected in parallel between the first connection tube 4 and the second connection tube 5. The liquid refrigerant condensed in the first heat exchange assembly 2 enters the plurality of second heat exchange assemblies 3 through the second connection tube 5, the liquid refrigerant in the respective second heat exchange assemblies 3 evaporates into the gaseous refrigerant, and then all the gaseous refrigerant enters the first connection tube 4, and further enters the first heat exchange assembly 2 through the first connection tube 4, so as to be condensed. Such heat exchange system 100 may flexibly adjust the number and size of the second heat exchange portions according to the change in the amount of heat exchange, so as to adapt to the application of the plurality of electronic control assemblies 200 or a combination of electronic control assemblies 200.

Figure 21:
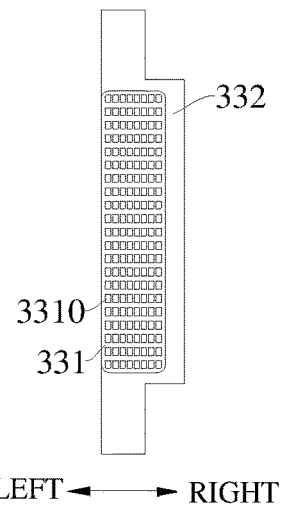
FIG. 21 is a sectional view of a heat exchange component in FIG. 20 along A-A.
Figure 22:
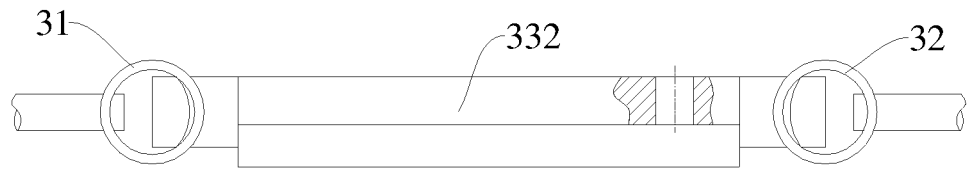
FIG. 22 is a top view of the second heat exchange assembly in FIG. 20.

It can be understood that the heat exchange component 33 according to the present disclosure is not limited to the above forms. For example, in some embodiments, the heat exchange component 33 includes a first component 332 and one first flat tube 331 penetrating through the first component 332 in the length direction of the first flat tube 331, so that two ends of the first flat tube 331 in the length direction of the first flat tube 331 are connected to the third tube 31 and the fourth tube 32, respectively. The width direction of the first flat tube 331 is substantially parallel to the length direction of the third tube 31, the first flat tube 331 has a first channel 3310 penetrating through the first flat tube 331 in the length direction of the first flat tube 331, and the first channel 3310 communicates the third tube 31 with the fourth tube 32. The first channels 3310 are arranged in a plurality of rows spaced apart from each other along the length direction of the third tube 31, and the first channels 3310 in each row are spaced apart from each other. As shown in FIGS. 20 and 21, the width direction of the first flat tube 331 is the front-rear direction, the thickness direction of the first flat tube 331 is the left-right direction, and the length direction of the first flat tube 331 is the up-down direction. The first component 332 includes a left side face and a right side face oppositely arranged in the left-right direction, and the right side face of the first component 332 may be in contact with the electronic control assembly 200. A groove is arranged in the left side face of the first component 332, a depth of the groove in the left-right direction is less than a size of the first component 332 in the left-right direction, the groove penetrates through the first component 332 in the up-down direction, and the first flat tube 3310 is arranged in the groove and penetrates through the first component 332 through the groove.

The first channels 3310 of the first flat tube 331 are arranged in the plurality of rows spaced apart from each other in the front-rear direction, and the first channels 3310 in each row are spaced apart from each other in the left-right direction. Specifically, a size of an upper end of the first component 332 in the front-rear direction and a size of a lower end of the first component 332 in the front-rear direction, are smaller than a size of a rest part of the first component 332. The upper end of the first component 332 is inserted in the third tube 31, and the lower end of the first component 332 is inserted in the fourth tube 32.

Further, as shown in FIG. 20, the first component 332 includes a front side face and a rear side face oppositely arranged in the front-rear direction, a fixing block is arranged to each of the front side face and the rear side face of the first component 332, and the fixing block is the fixing portion 9. The fixing block has a plurality of mounting holes 91 spaced apart from each other in the up-down direction, and a fastener may penetrate through each mounting hole 91 correspondingly. In other words, the second component 333 may be fixed to the electronic control assembly 200 through the fastener and the mounting hole 91. The fixing block may be integrally formed with the first component 332.

Figure 23:
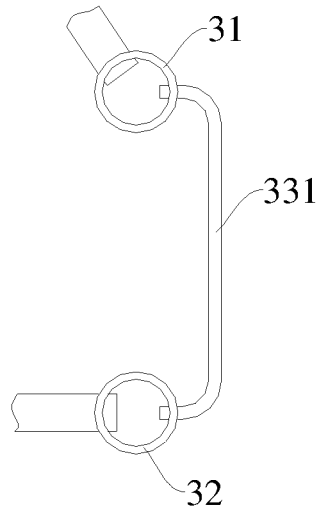
FIG. 23 is still another exemplary view of a second heat exchange assembly according to an embodiment of the present disclosure.
Figure 24:
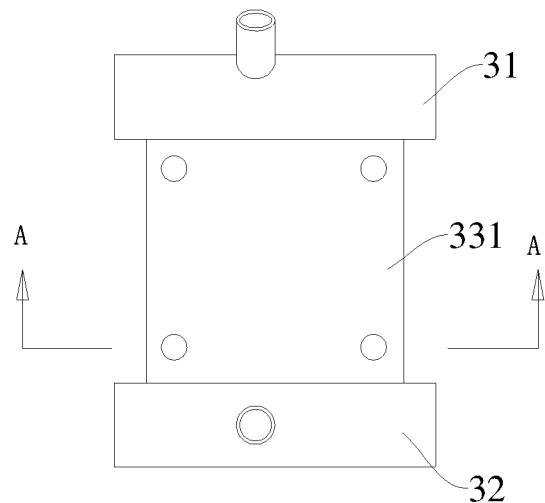
FIG. 24 is a side view of the second heat exchange assembly in FIG. 23.
Figure 25:
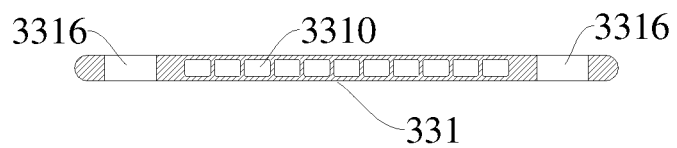
FIG. 25 is a sectional view of a heat exchange component in FIG. 24 along A-A.

It can be understood that in the above embodiments, the electronic control assembly 200 may be adhered to the heat exchange component 33. The present disclosure is not limited to this. For example, when one first flat tube 331 is provided, as shown in FIGS. 23 to 25, the first flat tube 331 has an opening 3316, and the opening 3316 penetrates through the first flat tube 331 in the thickness direction of the first flat tube 331, i.e., the opening penetrates through the first flat tube 331 in the left-right direction. The opening 3316 forms the mounting hole 91 in which the fastener is adapted to be mount in, and the first flat tube 331 is integrally formed with the fixing portion 9. The electronic control assembly 200 may be fixed to the right side face of the first flat tube 331 by the fastener.

It can be understood that the present disclosure is not limited to the embodiment of FIGS. 3 and 4 when one first flat tube 331 is provided. For example, as shown in FIGS. 26 and 27, the right side face of the first flat tube 331 is in contact with the electronic control assembly 200, a fixing plate forming the fixing portion 9 is arranged on the left side face of the first flat tube 331, and the fixing plate has the mounting hole 91, so as to fix the first flat tube 331 to the electronic control assembly 200 by mounting the fastener in the mounting hole 91. The fixing plate may be mounted separately or welded with the first flat tube 331.

In some embodiments, the first connection tube 4 and the second connection tube 5 are both a hose. In other words, the first tube 21 and the third tube 31 are connected to each other through the hose, and the second tube 22 and the fourth tube 32 are connected to each other through the hose, so that the mounting is relatively convenient.

It can be understood that the heat exchange system 100 for heat dissipation of the electronic control assembly according to the present disclosure is not limited to the form including the above first heat exchange assembly 2 and the above second heat exchange assembly 3. For example, in some embodiments, as shown in FIG. 28, the first heat exchange portion includes a second flat tube 6 and the second heat exchange portion includes a third flat tube 10. The second flat tube 6 includes a first side face and a second side face, and the first side face and the second side face of the second flat tube 6 are oppositely arranged in a thickness direction of the second flat tube 6. The second flat tube 6 further includes a third side face and a fourth side face, the third side face and the fourth side face of the second flat tube 6 are oppositely arranged in a width direction of the second flat tube 6. A distance between the first side face and the second side face of the second flat tube 6 is less than a distance between the third side face and the fourth side face of the second flat tube 6.

The second flat tube 6 includes a plurality of straight sections 61 and a plurality of curved sections 62, the plurality of straight sections 61 are spaced apart from each other, and two adjacent straight sections 61 are connected through the curved section 62. The second flat tube 6 includes a first end of the second flat tube and a second end of the second flat tube, the first communication port is arranged at the first end of the second flat tube, and the second communication port is arranged at the second end of the second flat tube. The third flat tube 10 includes a first side face and a second side face, and the first side face and the second side face of the third flat tube 10 are oppositely arranged in a thickness direction of the third flat tube 10. The third flat tube 10 further includes a third side face and a fourth side face, and the third side face and the fourth side face of the third flat tube 10 are oppositely arranged in a width direction of the third flat tube 10. A distance between the first side face and the second side face of the third flat tube 10 is less than a distance between the third side face and the fourth side face of the third flat tube 10. The third flat tube 10 includes a first end of the third flat tube and a second end of the third flat tube, the third communication port is arranged at the first end of the third flat tube, and the fourth communication port is arranged at the second end of the third flat tube. At least a part of a surface of the third flat tube 10 may be in contact with the electronic control assembly 200.

When the heat exchange system 100 is in use, the plurality of straight sections 61 are spaced apart from each other generally along the direction of gravity, the second end of the second flat tube is not higher than the first end of the second flat tube in the direction of gravity, and the second end of the third flat tube is lower than the first end of the third flat tube in the direction of gravity. As shown in FIG. 28, a length direction of the plurality of straight sections 61 is parallel to the left-right direction, the plurality of straight sections 61 are spaced apart from each other in the up-down direction, and a thickness direction of the straight section 61 is parallel to the up-down direction. The two adjacent straight sections 61 are connected through one curved section 62, so that the second flat tube 6 has a substantially serpentine shape. The second flat tube 6 includes a upper right end and a lower right end along the length direction of the second flat tube 6, and the lower right end of the second flat tube 6 is lower than the upper right end of the second flat tube 6 in the up-down direction. As shown in FIG. 28, a length direction of the third flat tube 10 is substantially parallel to the up-down direction, the thickness direction of the third flat tube 10 is substantially parallel to the left-right direction, the third flat tube 10 includes an upper end and a lower end in the up-down direction, and the lower end of the third flat tube 10 is lower than the upper end of the third flat tube 10.

Specifically, a side face of the third flat tube 10 facing away from the second flat tube 6 in the thickness direction of the third flat tube 10 may be in contact with the electronic control assembly 200, so as to exchange heat with the electronic control assembly 200. As shown in FIG. 28, a side face of the third flat tube 10 facing away from the second flat tube 6 in the left-right direction is a right side face of the third flat tube 10, and the right side face of the third flat tube 10 may be fixed to the electronic control assembly 200. Specifically, a fixing plate serving as the fixing portion 9 is arranged on the other side face of two side faces of the third flat tube 10 oppositely arranged in the thickness direction of the third flat tube 10, the fixing plate has a mounting hole 91, and the third flat tube 10 is fastened to the electronic control assembly 200 by a fastener penetrating the mounting hole 91. As shown in FIG. 28, a side face of the third flat tube 10 adjacent to the second flat tube 6 in the left-right direction is a left side face of the third flat tube 10 and the fixing plate is arranged on the left side face of the third flat tube 10. Thus, the liquid refrigerant in the third flat tube 10 of the second heat exchange portion is evaporated into the gaseous refrigerant by absorbing heat from the electronic control assembly 200 through one side face of the two side faces oppositely arranged in the thickness direction, and enters a relatively high-positioned end of the second flat tube 6 of the first heat exchange portion through a relatively high-positioned end of the third flat tube 10 and the first connection tube 4. In other words, the first connection tube 4 may guide the gaseous refrigerant in the third flat tube 10 into the second flat tube 6.

The gaseous refrigerant in the second flat tube 6 condenses into the liquid refrigerant and enters a relatively lower-positioned end of the second flat tube 6. Since the relatively lower-positioned end of the second flat tube 6 is higher than a relatively lower-positioned end of the third flat tube 10, the liquid refrigerant in the second flat tube 6 may flow into the relatively lower-positioned end of the third flat tube 10 through the relatively lower-positioned end of the second flat tube 6 and the second connection tube 5 by means of its own weight. Specifically, the second flat tube 6 is arranged adjacent to a fan 1. The first heat exchange portion further includes a second fin 7 arranged between adjacent straight sections 61. Thus, by providing the second fin 7 between the adjacent straight sections 61, the heat exchange area between the two adjacent straight sections 61 can be increased and the heat exchange efficiency of the first heat exchange portion can be improved. As shown in FIG. 28, the first heat exchange portion is adjacent to the fan 1 and located on a right side of the fan 1, the fan 1 has an air outlet, the first heat exchange portion has a windward side and a leeward side, and the windward side of the first heat exchange portion is opposite to the air outlet of the fan 1 so that a wind blown out by the fan 1 through the air outlet may enter the first heat exchange portion. Therefore, the gaseous refrigerant in the first heat exchange portion may be accelerated to liquefy into the liquid refrigerant under the action of the fan 1, thus improving the heat exchange effect.

In some embodiments, the heat exchange system 100 for heat dissipation of the electronic control assembly further includes a liquid storage member 8 having a liquid storage cavity 81, and the second end of the second flat tube is connected to the first end 5001 of the second connection tube through the liquid storage member 8, so as to communicate the second flat tube 6 with the second connection tube 5 through the liquid storage cavity 81. By providing the liquid storage member 8 between the first heat exchange portion and the second heat exchange portion, the liquid refrigerant can be stored, thus preventing the dry heating of the heat tube.

In some embodiments, the heat exchange system 100 for heat dissipation of the electronic control assembly further includes a third connection tube 11, and the second end of the second flat tube is connected to the liquid storage member 8 through the third connection tube 11 so as to communicate the liquid storage member 81 with the second flat tube 6. Specifically, one outermost straight section (an uppermost straight section) of the plurality of straight sections 61 in the direction of gravity is connected to one end of the third flat tube 10 in the direction of gravity through the first connection tube 4, the other outermost straight section (a lowermost straight section) of the plurality of straight sections 61 in the direction of gravity is connected to the liquid storage member 8 through the third connection tube 11, and the liquid storage member 8 is connected to the other end of the third flat tube 10 in the direction of gravity through the second connection tube 5. As shown in FIG. 28, the plurality of straight sections 61 includes a first outermost straight section and a second outermost straight section located on outermost sides in the up-down direction, and the first outermost straight section is located above the second outermost straight section. A right end of the first outermost straight section is connected to an upper end of the third flat tube 10 through the first connection tube 4, a right end of the second outermost straight section is connected to the liquid storage member 8 through the third connection tube 11, and the liquid storage member 8 is connected to a lower end of the third flat tube 10 through the second connection tube 5.

Further, the third connection tube 11, the second flat tube 6, the first connection tube 4, the third flat tube 10 and the second connection tube 5 are formed by one continuous tube. In other words, the first connection tube 4, the second connection tube 5 and the third connection tube 11 are all a flat tube, and the third connection tube 11, the second flat tube 6, the first connection tube 4, the third flat tube 10 and the second connection tube 5 are formed by one flat tube. That is, the heat exchange system 100 for heat dissipation of the electronic control assembly includes one flat tube which is bent to form the third connection tube 11, the plurality of straight sections 61, the plurality of curved sections 62, the first connection tube 4, the third flat tube 10 and the second connection tube 5. This flat tube has a plurality of curved portions. As shown in FIG. 28, the first end of the second flat tube and the first end 4001 of the first connection tube are both located at a curved portion, the second end 4002 of the first connection tube and the first end of the third flat tube are both located at another curved portion, the second end of the second flat tube and one end of the third connection tube 11 are both located at still another curved portion, and the second end 5002 of the second connection tube and the second end of the third flat tube are both located at still another curved portion.

A computer host according to the embodiments of the present disclosure is described below.

Figure 29:
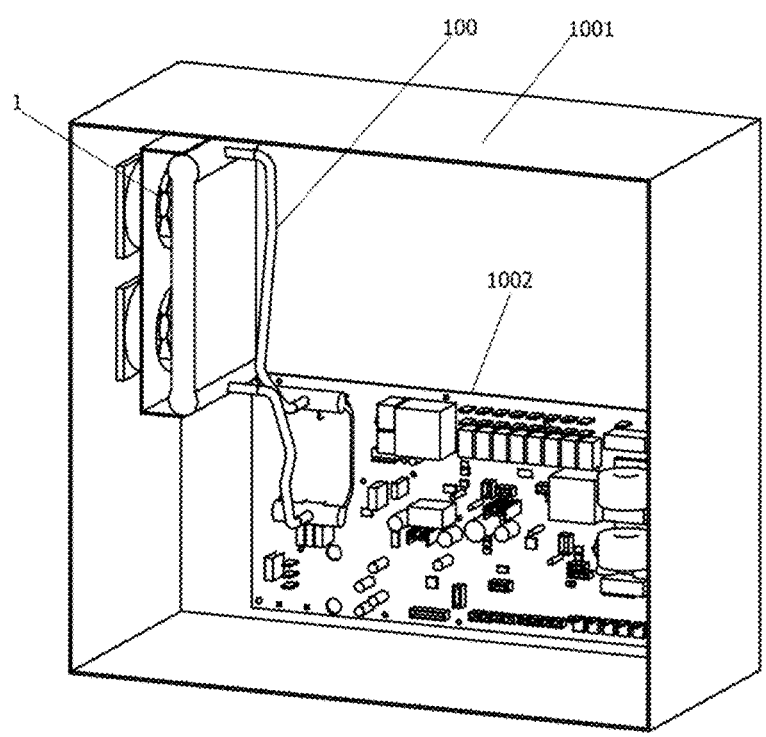
FIG. 29 is a schematic view of a chassis with a main board and a heat exchange system therein.

The computer host according to the embodiments of the present disclosure includes a chassis 1001, a fan or a blower 1, a main board 1002 and a heat exchange system 100 as shown in FIG. 29. The main board 1002 is arranged in the chassis 1001, an electronic control assembly 200 is mounted on the main board 1002, and the electronic control assembly 200 includes a chip. The fan or the blower 1 is arranged in the chassis 1001. The heat exchange system 100 is arranged in the chassis 1001, and is the above heat exchange system 100 for heat dissipation of the electronic control assembly according to the embodiments of the present disclosure. The first heat exchange portion of the heat exchange system 100 is arranged adjacent to the fan or the blower 1, and a spacing is defined between the first heat exchange portion and the second heat exchange portion of the heat exchange system 100 in a horizontal direction. As shown in FIG. 1, the spacing is defined between the first heat exchange portion and the second heat exchange portion of the heat exchange system 100 in the left-right direction.

At least a part of the second heat exchange portion of the heat exchange system 100 is in contact with the chip of the electronic control assembly 200, and the heat exchange system 100 for heat dissipation of the electronic control assembly according to the embodiments of the present disclosure is in the operative state, i.e., the second end 2002 of the first heat exchange portion is not higher than the first end 2001 of the first heat exchange portion in the direction of gravity, the second end 3002 of the second heat exchange portion is lower than the first end 3001 of the second heat exchange portion in the direction of gravity, the third communication port is lower than the first communication port in the direction of gravity, and the fourth communication port is lower than the second communication port in the direction of gravity. Therefore, after the liquid refrigerant in the second heat exchange portion absorbs heat from the electronic control assembly 200, the liquid refrigerant is converted into the gaseous refrigerant and then enters the first heat exchange portion through the first connection tube 4. The gaseous refrigerant in the first heat exchange portion is condensed into the liquid refrigerant and then enters the second heat exchange portion through the second connection tube 5. The first heat exchange portion, the first connection tube 4, the second heat exchanging portion and the second connection tube form a circulating system, and the refrigerant circulates in the circulating system, so as to achieve the heat dissipation of the electronic control assembly 200.

A heat exchange system for heat dissipation of an electronic control assembly according to embodiments of the present disclosures includes: a first heat exchange portion including a first end 2001 of the first heat exchange portion and a second end 2002 of the first heat exchange portion arranged opposite to each other, the first end 2001 of the first heat exchange portion having a first communication port, the second end 2002 of the first heat exchange portion having a second communication port, and the first communication port being in communication with the second communication port; a second heat exchange portion including a first end 3001 of the second heat exchange portion and a second end 3002 of the second heat exchange portion arranged opposite to each other, the first end 3001 of the second heat exchange portion having a third communication port, the second end 3002 of the second heat exchange portion having a fourth communication port, the fourth communication port being in communication with the third communication port, and at least a part of the second heat exchange portion being configured to be in contact with the electronic control assembly, so as to be in conduction with the electronic control assembly to dissipate heat; a first connection tube including a first end 4001 of the first connection tube and a second end 4002 of the first connection tube, the first end 4001 of the first connection tube being connected to the first end 2001 of the first heat exchange portion through the first communication port, and the second end 4002 of the first connection tube being connected to the first end 3001 of the second heat exchange portion through the third communication port, so as to communicate the first heat exchange portion with the second heat exchange portion; and a second connection tube including a first end 5001 of the second connection tube and a second end 5002 of the second connection tube, the first end 5001 of the second connection tube being connected to the second end 2002 of the first heat exchange portion through the second communication port, and the second end 5002 of the second connection tube being connected to the second end 3002 of the second heat exchange portion through the fourth communication port, so as to communicate the first heat exchange portion with the second heat exchange portion. The first heat exchange portion, the first connection tube, the second heat exchange portion and the second connection tube constitute a loop, at least one of the first heat exchange portion, the first connection tube, the second heat exchange portion and the second connection tube has an opening, the opening is closed when the heat exchange system is in an operative state, the second end 2002 of the first heat exchange portion is not higher than the first end 2001 of the first heat exchange portion in a direction of gravity, the second end 3002 of the second heat exchange portion is lower than the first end 3001 of the second heat exchange portion in the direction of gravity, the third communication port is lower than the first communication port in the direction of gravity, and the fourth communication port is lower than the second communication port in the direction of gravity.

In some embodiments, the first heat exchange portion includes a first tube, a second tube and a plurality of heat exchange tubes, the second tube and the first tube are spaced apart from each other, the plurality of heat exchange tubes are spaced apart from each other along a length direction of the first tube, one end of at least one of the heat exchange tubes in a length direction thereof is connected to the first tube, the other end of the at least one heat exchange tube in the length direction thereof is connected to the second tube, so as to communicate the first tube with the second tube, the first communication port is arranged at the first tube, and the second communication port is arranged at the second tube; the second heat exchange portion includes a third tube, a heat exchange component and a fourth tube, the fourth tube and the third tube are spaced apart from each other, the third communication port is arranged at the third tube, the fourth communication port is arranged at the fourth tube, one end of two opposite ends of the heat exchange component is connected to the third tube, the other end of the two opposite ends of the heat exchange component is connected to the fourth tube, the heat exchange component includes a plurality of channels communicating the third tube with the fourth tube, and at least a part of a surface of the heat exchange component is configured to be in contact with the electronic control assembly; the first end 4001 of the first connection tube is connected to the first tube through the first communication port, the second end 4002 of the first connection tube is connected to the third tube through the third communication port, so as to communicate the first tube with the third tube, the first end 5001 of the second connection tube is connected to the second tube through the second communication port, and the second end 5002 of the second connection tube is connected to the fourth tube through the fourth communication port, so as to communicate the second tube with the fourth tube; when the heat exchange system is in use, a junction of the at least one heat exchange tube of the first heat exchange portion to the second tube is not higher than a junction of the at least one heat exchange tube to the first tube in the direction of gravity, a communication point of at least one of the channels of the second heat exchange portion to the fourth tube is lower than a communication point of the at least one channel to the third tube in the direction of gravity, a position of the third communication port is lower than a position of the first communication port in the direction of gravity, and a position of the fourth communication port is lower than a position of the second communication port in the direction of gravity.

In some embodiments, the plurality of channels are spaced apart from each other along a length direction of the third tube.

In some embodiments, the heat exchange component includes at least one first flat tube, the first flat tube includes a first side face and a second side face, the first side face and the second side face of the first flat tube are oppositely arranged in a thickness direction of the first flat tube, the first flat tube further includes a third side face and a fourth side face, the third side face and the fourth side face of the first flat tube are oppositely arranged in a width direction of the first flat tube, a distance between the first side face and the second side face of the first flat tube is less than a distance between the third side face and the fourth side face of the first flat tube, the width direction of the first flat tube is substantially parallel to the length direction of the third tube, one end of two opposite ends of the first flat tube in a length direction of the first flat tube opposite is connected to the third tube, the other end of the two opposite ends of the first flat tube in the length direction of the first flat tube opposite is connected to the fourth tube, the first flat tube includes the plurality of channels, the plurality of channels are spaced apart from each other along the width direction of the first flat tube, and one side face of the first side face or the second side face of the first flat tube is in contact with the electronic control assembly.

In some embodiments, the heat exchange component includes a second component, one end of two oppositely-arranged ends of the second component is connected to the third tube, the other end of the two oppositely-arranged ends of the second component is connected to the fourth tube, the second component includes the plurality of channels, at least a part of a surface of the second component is configured to be in contact with the electric control assembly, the channel has a length and a width, a length direction of the channel is substantially perpendicular to the length direction of the third tube, and the width of the channel is not greater than a diameter of the third tube or a diameter of the fourth tube.

In some embodiments, the plurality of channels are divided into a plurality of groups spaced apart from each other along a length direction of the third tube, and the channels in each group are spaced apart from each other.

In some embodiments, the heat exchange component includes a plurality of first flat tubes, the plurality of first flat tubes are spaced apart from each other along the length direction of the third tube, a thickness direction of the first flat tube is parallel to the length direction of the third tube, or an included angle between a thickness direction of the first flat tube and the length direction of the third tube is greater than 0° and less than 90°.

In some embodiments, a thickness of the first flat tube gradually increases in a width direction of the first flat tube.

In some embodiments, a plurality of second heat exchange portions are provided, and the plurality of second heat exchange portions are connected in parallel between the first connection tube and the second connection tube.

In some embodiments, the first heat exchange portion includes a second flat tube, the second flat tube includes a first side face and a second side face, the first side face and the second side face of the second flat tube are oppositely arranged in a thickness direction of the second flat tube, the second flat tube further includes a third side face and a fourth side face, the third side face and the fourth side face of the second flat tube are oppositely arranged in a width direction of the second flat tube, a distance between the first side face and the second side face of the second flat tube is less than a distance between the third side face and the fourth side face of the second flat tube, the second flat tube includes a plurality of straight sections and a plurality of curved sections, the plurality of straight sections are spaced apart from each other, two adjacent straight sections are connected through the curved section, the second flat tube includes a first end of the second flat tube and a second end of the second flat tube, the first communication port is arranged at the first end of the second flat tube, and the second communication port is arranged at the second end of the second flat tube; the second heat exchange portion includes a third flat tube, the third flat tube includes a first side face and a second side face, the first side face and the second side face of the third flat tube are oppositely arranged in a thickness direction of the third flat tube, the third flat tube further includes a third side face and a fourth side face, the third side face and the fourth side face of the third flat tube are oppositely arranged in a width direction of the third flat tube, a distance between the first side face and the second side face of the third flat tube is less than a distance between the third side face and the fourth side face of the third flat tube, the third flat tube includes a first end of the third flat tube and a second end of the third flat tube, the third communication port is arranged at the first end of the third flat tube, the fourth communication port is arranged at the second end of the third flat tube, and at least a part of a surface of the third flat tube is configured to be in contact with the electronic control assembly; the first end 4001 of the first connection tube is connected to the first end of the second flat tube through the first communication port, and the second end 4002 of the first connection tube is connected to the first end of the third flat tube through the third communication port, so as to communicate the second flat tube with the third flat tube; the first end of the second connection tube is connected to the second end of the second flat tube through the second communication port, and the second end 5002 of the second connection tube is connected to the second end of the third flat tube through the fourth communication port, so as to communicate the second flat tube with the third flat tube; when the heat exchange system is in use, the plurality of straight sections are spaced apart from each other generally along the direction of gravity, the second end of the second flat tube is not higher than the first end of the second flat tube in the direction of gravity, the second end of the third flat tube is lower than the first end of the third flat tube in the direction of gravity, a junction of the first connection tube to the third flat tube is lower than a junction of the first connection tube to the second flat tube, and a junction of the second connection tube to the third flat tube is lower than a junction of the second connection tube to the second flat tube in the direction of gravity.

In some embodiments, the second flat tube, the first connection tube, the third flat tube and the second connection tube are formed by one continuous tube.

In some embodiments, the heat exchange system for heat dissipation of the electronic control further includes a liquid storage member having a liquid storage cavity. The second end of the second flat tube is connected to the first end of the second connection tube through the liquid storage member, so as to communicate the second flat tube with the second connection tube through the liquid storage cavity.

A computer host according to embodiments of the present disclosure includes: a chassis 1001; a main board 1002 arranged in the chassis 1001, an electronic control assembly being mounted on the main board 1002 and including a chip; a fan or a blower arranged in the chassis 1001; and a heat exchange system arranged in the chassis 1001, the heat exchange system being a heat exchange system for heat dissipation of an electronic control assembly according to any one of the above embodiments. The first heat exchange portion is arranged adjacent to the fan or the blower, a spacing is defined between the second heat exchange portion and the first heat exchange portion in a horizontal direction, at least a part of a surface of the second heat exchange portion is in contact with the chip, the second end 2002 of the first heat exchange portion is lower than the first end 2001 of the first heat exchange portion in the direction of gravity, the second end 3002 of the second heat exchange portion is lower than the first end 3001 of the second heat exchange portion in the direction of gravity, the third communication port is lower than the first communication port in the direction of gravity, and the fourth communication port is lower than the second communication port in the direction of gravity.

A heat exchange system for heat dissipation of an electronic control assembly according to embodiments of the present disclosure includes: a first heat exchange assembly including a first tube, a second tube and a plurality of heat exchange tubes, the second tube and the first tube being spaced apart from each other, the plurality of heat exchange tubes being spaced apart from each other along a length direction of the first tube, one end of at least one of the heat exchange tubes in a length direction thereof being connected to the first tube, the other end of the at least one heat exchange tube in the length direction thereof being connected to the second tube, so as to communicate the first tube with the second tube, the first tube having a first communication port, and the second tube having a second communication port; a second heat exchange assembly including a third tube, a fourth tube and at least one first flat tube, the fourth tube and the third tube being spaced apart from each other, the third tube having a third communication port, the fourth tube having a fourth communication port, the first flat tube including a first side face and a second side face, the first side face and the second side face of the first flat tube being oppositely arranged in a thickness direction of the first flat tube, the first flat tube further including a third side face and a fourth side face, the third side face and the fourth side face of the first flat tube being oppositely arranged in a width direction of the first flat tube, a distance between the first side face and the second side face of the first flat tube being less than a distance between the third side face and the fourth side face of the first flat tube, the width direction of the first flat tube being substantially parallel to a length direction of the third tube, one end of the first flat tube in a length direction thereof being connected to the third tube, the other end of the first flat tube in the length direction thereof being connected to the fourth tube, the first flat tube including a plurality of first channels, the plurality of first channels being spaced apart from each other along the width direction of the first flat tube, the first channel extending in the length direction of the first flat tube, so as to communicate the third tube with the fourth tube, and one side face of the first side face or the second side face of the first flat tube being configured to be in contact with a chip, so as to be in conduction with the chip to dissipate heat; a first connection tube including a first end 4001 of the first connection tube and a second end 4002 of the first connection tube, the first end 4001 of the first connection tube being connected to the first tube through the first communication port, and the second end 4002 of the first connection tube being connected to the third tube through the third communication port, so as to communicate the first tube with the third tube; and a second connection tube including a first end of the second connection tube and a second end 5002 of the second connection tube, the first end of the second connection tube being connected to the second tube through the second communication port, and the second end 5002 of the second connection tube being connected to the fourth tube through the fourth communication port, so as to communicate the second tube with the fourth tube. When the heat exchange system is in use, a junction of the at least one heat exchange tube of the first heat exchange assembly to the second tube is not higher than a junction of the at least one heat exchange tube to the first tube in a direction of gravity, a junction of the at least one first flat tube of the second heat exchange assembly to the fourth tube is lower than a junction of the at least one first flat tube to the third tube in the direction of gravity, a position of the third communication port is lower than a position of the first communication port in the direction of gravity, and a position of the fourth communication port is lower than a position of the second communication port in the direction of gravity.

In some embodiments, the heat exchange system for heat dissipation of the electronic control assembly further includes a first component having a first side face and a second side face arranged opposite to each other, the first component has a slot hole including an open end and a closed end, the open end of the slot hole is arranged in the first side face of the first component, a connection portion is arranged between the closed end of the slot hole and the second side face of the first component, the at least one first flat tube is fitted and arranged in the slot hole, so as to be in contact with the first component, and the other side face of the first side face or the second side face of the first flat tube is in contact with a bottom face of the slot hole.

In some embodiments, a plurality of protrusion portions are arranged on the second side face of the first component, and a gap is defined between any two adjacent protrusion portions.

A heat exchange system for heat dissipation of an electronic control assembly according to embodiments of the present disclosure includes: a first heat exchange assembly including a first tube, a second tube and a plurality of heat exchange tubes, the second tube and the first tube being spaced apart from each other, the plurality of heat exchange tubes being spaced apart from each other along a length direction of the first tube, one end of at least one of the heat exchange tubes in a length direction thereof being connected to the first tube, the other end of the at least one heat exchange tube in the length direction thereof being connected to the second tube, so as to communicate the first tube with the second tube, the first tube having a first communication port, and the second tube having a second communication port; a second heat exchange assembly including a third tube, a second component and a fourth tube, the fourth tube and the third tube being spaced apart from each other, the third tube having a third communication port, the fourth tube having a fourth communication port, one end of two opposite ends of the second component being connected to the third tube, the other end of the two opposite ends of the second component being connected to the fourth tube, the second component having a plurality of second channels, the second channel communicating the third tube with the fourth tube, at least a part of a surface of the second component being configured to be in contact with a chip, so as to be in conduction the chip to dissipate heat; a first connection tube including a first end 4001 of the first connection tube and a second end 4002 of the first connection tube, the first end 4001 of the first connection tube being connected to the first tube through the first communication port, and the second end 4002 of the first connection tube being connected to the third tube through the third communication port, so as to communicate the first tube with the third tube; and a second connection tube including a first end 5001 of the second connection tube and a second end 5002 of the second connection tube, the first end 5001 of the second connection tube being connected to the second tube through the second communication port, and the second end 5002 of the second connection tube being connected to the fourth tube through the fourth communication port, so as to communicate the second tube with the fourth tube. When the heat exchange system is in use, a junction of the at least one heat exchange tube to the second tube is not higher than a junction of the at least one heat exchange tube to the first tube in a direction of gravity, a communication point of at least one of the second channels to the fourth tube is lower than a communication point of the at least one second channel to the third tube in the direction of gravity, a position of the third communication port is lower than a position of the first communication port in the direction of gravity, and a position of the fourth communication port is lower than a position of the second communication port in the direction of gravity.

In some embodiments, the second channel has a length and a width, and the width of the second channel is less than or equal to a diameter of the third tube or a diameter of the fourth tube.

A heat exchange system for heat dissipation of an electronic control assembly according to embodiments of the present disclosure includes: a first heat exchange portion including a second flat tube, the second flat tube including a first side face and a second side face, the first side face and the second side face of the second flat tube being oppositely arranged in a thickness direction of the second flat tube, the second flat tube further including a third side face and a fourth side face, the third side face and the fourth side face of the second flat tube being oppositely arranged in a width direction of the second flat tube, a distance between the first side face and the second side face of the second flat tube being less than a distance between the third side face and the fourth side face of the second flat tube, the second flat tube including a plurality of straight sections and a plurality of curved sections, the plurality of straight sections being spaced apart from each other, two adjacent straight sections being connected through the curved section, and the second flat tube including a first end of the second flat tube and a second end of the second flat tube; a second heat exchange portion including a third flat tube, the third flat tube including a first end of the third flat tube and a second end of the third flat tube, the third flat tube including a first side face and a second side face, the first side face and the second side face of the third flat tube being oppositely arranged in a thickness direction of the third flat tube, the third flat tube further including a third side face and a fourth side face, the third side face and the fourth side face of the third flat tube being oppositely arranged in a width direction of the third flat tube, a distance between the first side face and the second side face of the third flat tube is less than a distance between the third side face and the fourth side face of the third flat tube, and one side face of the first side face or the second side face of the third flat tube being configured to be in contact with a chip, so as to be in conduction with the chip to dissipate heat; a first connection tube including a first end 4001 of the first connection tube and a second end 4002 of the first connection tube, the first end 4001 of the first connection tube being connected to the first end of the second flat tube, and the second end 4002 of the first connection tube being connected to the first end of the third flat tube; and a second connection tube including a first end 5001 of the second connection tube and a second end 5002 of the second connection tube, the first end 5001 of the second connection tube being connected to the second end of the second flat tube, and the second end 5002 of the second connection tube being connected to the second end of the third flat tube. When the heat exchange system is in use, the plurality of straight sections are spaced apart from each other generally along a direction of gravity, the second end of the second flat tube is not higher than the first end of the second flat tube in the direction of gravity, the second end of the third flat tube is lower than the first end of the third flat tube in the direction of gravity, a junction of the first connection tube to the third flat tube is lower than a junction of the first connection tube to the second flat tube, and a junction of the second connection tube to the third flat tube is lower than a junction of the second connection tube to the second flat tube in the direction of gravity.

In some embodiments, the heat exchange system for heat dissipation of the electronic control assembly further includes a third connection tube and a liquid storage member, the third connection tube includes a first end of the third connection tube and a second end of the third connection tube, the first end of the third connection tube is connected to the second end of the second flat tube, the second end of the third connection tube is connected to the first end 5001 of the second connection tube through the liquid storage member, so as to communicate the second flat tube with the second connection tube through the third connection tube and the liquid storage cavity.

In some embodiments, the third connection tube, the second flat tube, the first connection tube, the third flat tube and the second connection tube are formed by one continuous tube.

A heat exchange system for heat dissipation of an electronic control assembly according to embodiments of the present disclosure includes: a first heat exchange assembly including a first tube, a second tube and a plurality of heat exchange tubes, the second tube and the first tube being spaced apart from each other, the plurality of heat exchange tubes being spaced apart from each other along a length direction of the first tube, one end of at least one of the heat exchange tubes in a length direction thereof being connected to the first tube, the other end of the at least one heat exchange tube in the length direction thereof being connected to the second tube, so as to communicate the first tube with the second tube, the first tube having a first communication port, and the second tube having a second communication port; a second heat exchange assembly including a third tube, a heat exchange component and a fourth tube, the fourth tube and the third tube being spaced apart from each other, the third tube having a third communication port, the fourth tube having a fourth communication port, the heat exchange component including a first component and at least one first flat tube, the first flat tube including a first side face and a second side face, the first side face and the second side face of the first flat tube being oppositely arranged in a thickness direction of the first flat tube, the first flat tube further including a third side face and a fourth side face, the third side face and the fourth side face of the first flat tube being oppositely arranged in a width direction of the first flat tube, a distance between the first side face and the second side face of the first flat tube being less than a distance between the third side face and the fourth side face of the first flat tube, one end of two opposite ends of the first flat tube in a length direction thereof being connected to the third tube, the other end of the two opposite ends of the first flat tube in the length direction thereof being connected to the fourth tube, the first flat tube including a plurality of first channels, the plurality of first channels being spaced apart from each other in the width direction of the first flat tube, the first channel extending in a length direction of the first flat tube, so as to communicate the third tube with the fourth tube, a part of the first component being in contact with the first side face or the second side face of the first flat tube, and at least a part of the rest of the first component being configured to be in contact with the electronic control assembly, so as to be in conduction with the electronic control assembly to dissipate heat; a first connection tube including a first end 4001 of the first connection tube and a second end 4002 of the first connection tube, the first end 4001 of the first connection tube being connected to the first tube through the first communication port, and the second end 4002 of the first connection tube being connected to the third tube through the third communication port, so as to communicate the first tube with the third tube; and a second connection tube including a first end 5001 of the second connection tube and a second end 5002 of the second connection tube, the first end 5001 of the second connection tube being connected to the second tube through the second communication port, and the second end 5002 of the second connection tube being connected to the fourth tube through the fourth communication port, so as to communicate the second tube with the fourth tube. When the heat exchange system is in use, a junction of the at least one heat exchange tube of the first heat exchange assembly to the second tube is not higher than a junction of the at least one heat exchange tube to the first tube in a direction of gravity, a junction of the at least one first flat tube of the second heat exchange assembly to the fourth tube is lower than a junction of the at least one first flat tube to the third tube in the direction of gravity, a position of the third communication port is lower than a position of the first communication port in the direction of gravity, and a position of the fourth communication port is lower than a position of the second communication port in the direction of gravity.

In some embodiments, a plurality of first flat tubes are provided, the plurality of first flat tubes are spaced apart from each other along a length direction of the third tube, the thickness direction of the first flat tube is parallel to the length direction of the third tube, or an included angle between the thickness direction of the first flat tube and the length direction of the third tube is greater than 0° and less than 90°.

In some embodiments, the first component includes a first side face and a second side face arranged opposite to each other, the first side face of the first component is configured to be in contact with the electronic control assembly, the first component has a plurality of first slot holes, the first slot hole includes an open end and a closed end, the open end of the first slot hole is arranged in the second side face of the first component, a connection portion is arranged between the closed end of the first slot hole and the first side face of the first component, the plurality of first slot holes are spaced apart from each other along the length direction of the third tube, the first flat tube is fitted and arranged in the first slot hole, so as to be in contact with the first component, the first slot hole includes a bottom face and a side wall face, at least one side face of the third side face or the fourth side face of the first flat tube is in contact with the side wall face of the first slot hole, and the first side face or the second side face of the first flat tube is in contact with the bottom face of the first slot hole.

In some embodiments, the first component is formed by a plurality of first blocks spliced together, the first block has a thickness direction substantially parallel to the length direction of the third tube, and the plurality of first blocks are arranged sequentially along the length direction of the third tube.

In some embodiments, the first component includes a second block and a plurality of third blocks, the plurality of third blocks are spaced apart from each other along the length direction of the third tube, the second block includes a first surface and a second surface arranged opposite to each other, the first surface of the second block is the first side face of the first component, the second surface of the second block has a second slot hole, the plurality of third blocks are partially arranged in the second slot hole, the second slot hole includes a bottom face, a plurality of protrusions are arranged on the bottom face of the second slot hole, the plurality of protrusions are spaced apart from each other along the length direction of the third tube, the protrusion is located between adjacent third blocks, and the third side face or the fourth side face of the first flat tube is in contact with the protrusion.

In some embodiments, the third block includes two opposite side faces, one side face of the two side faces of the third block is in contact with the bottom face of the second slot hole, and the other side face of the two side faces of the third block is located outside the second slot hole.

In some embodiments, the first flat tube includes a first section, a first curved section, a middle section, a second curved section and a second section, one end of the first section in a length direction thereof is connected to the third tube, the other end of the first section in the length direction thereof is connected to one end of the first curved section, the other end of the first curved section is connected to one end of the middle section in a length direction thereof, the other end of the middle section in the length direction thereof is connected to one end of the second curved section, the other end of the second curved section is connected to one end of the second section in a length direction thereof, the other end of the second section in the length direction thereof is connected to the fourth tube, a first side face of the first section has a first side edge extending in the length direction of the first section, a first side face of the middle section has a middle side edge extending in the length direction of the middle section, a first side face of the second section has a second side edge extending in the length direction of the second section, the first side edge and the middle side edge are angled, and the second side edge and the middle side edge are angled.

In some embodiments, the width direction of the first flat tube is generally parallel to a length direction of the third tube, the first component includes a first side face and a second side face arranged opposite to each other, the first side face of the first component is configured to be in contact with the electronic control assembly, the first component has a third slot hole, the third slot hole includes an open end and a closed end, the open end of the third slot hole is arranged in the second side face of the first component, a connection portion is arranged between the closed end of the third slot hole and the first side face of the first component, the at least one first flat tube is fitted and arranged in the third slot hole, so as to be in contact with the first component, the third slot hole includes a bottom face and a side wall face, the first side face or the second side face of the first flat tube is in contact with the bottom face of the third slot hole, and at least one side face of the third side face or the fourth side face of the first flat tube is in contact with the third slot hole.

In some embodiments, the first component includes the first side face and the second side face arranged opposite to each other, the first side face or the second side face of the first component is configured to be in contact with the electronic control assembly, the first component has a through hole, and the at least one first flat tube is fitted in the through hole, so as to be in contact with the first component.

In the description of the present disclosure, terms such as "an embodiment," "some embodiments," "an example," "a specific example," or "some examples," means that a particular feature, structure, material, or characteristic described in connection with the embodiment or example is included in at least one embodiment or example of the present disclosure. Thus, the appearances of these terms in various places throughout this specification are not necessarily referring to the same embodiment or example of the present disclosure. Furthermore, the particular features, structures, materials, or characteristics may be combined in any suitable manner in one or more embodiments or examples. In addition, without contradiction, those skilled in the art may combine and unite different embodiments or examples or features of the different embodiments or examples described in this specification. Terms such as "mounting," "interconnection," "connection," "fixing" shall be understood broadly. Terms "first" and "second" are only used for descriptive purposes and cannot be understood as indicating or implying relative importance or implicitly indicating the number of indicated technical features. Thus, the features defined by "first" and "second" may include at least one of the features explicitly or implicitly. In the description of the present disclosure, "a plurality of" means at least two such as two or three, unless otherwise expressly and specifically defined.

Although the embodiments of the present disclosure have been shown and described above, it can be understood that the above embodiments are exemplary and shall not be understood as limitation to the present disclosure, and changes, modifications, alternatives and variations can be made in the above embodiments within the scope of the present disclosure by those skilled in the art.

What is claimed is:

1. A heat exchange system for heat dissipation of an electronic control assembly, comprising:
    a first heat exchange portion comprising a first end of the first heat exchange portion and a second end of the first heat exchange portion arranged opposite to each other, the first end of the first heat exchange portion having a first communication port, the second end of the first heat exchange portion having a second communication port, and the first communication port being in communication with the second communication port;
    a second heat exchange portion comprising a first end of the second heat exchange portion and a second end of the second heat exchange portion arranged opposite to each other, the first end of the second heat exchange portion having a third communication port, the second end of the second heat exchange portion having a fourth communication port, the fourth communication port being in communication with the third communication port, and at least a part of the second heat exchange portion being configured to be in contact with the electronic control assembly, so as to be in conduction with the electronic control assembly to dissipate heat;
    a first connection tube comprising a first end of the first connection tube and a second end of the first connection tube, the first end of the first connection tube being connected to the first end of the first heat exchange portion through the first communication port, and the second end of the first connection tube being connected to the first end of the second heat exchange portion through the third communication port, so as to communicate the first heat exchange portion with the second heat exchange portion; and
    a second connection tube comprising a first end of the second connection tube and a second end of the second connection tube, the first end of the second connection tube being connected to the second end of the first heat exchange portion through the second communication port, and the second end of the second connection tube being connected to the second end of the second heat exchange portion through the fourth communication port, so as to communicate the first heat exchange portion with the second heat exchange portion,
    wherein the first heat exchange portion, the first connection tube, the second heat exchange portion and the second connection tube constitute a loop, at least one of the first heat exchange portion, the first connection tube, the second heat exchange portion and the second connection tube has an opening, the opening is closed when the heat exchange system is in an operative state, the second end of the first heat exchange portion is not higher than the first end of the first heat exchange portion in a direction of gravity, the second end of the second heat exchange portion is lower than the first end of the second heat exchange portion in the direction of gravity, the third communication port is lower than the first communication port in the direction of gravity, and the fourth communication port is lower than the second communication port in the direction of gravity;
    wherein the first heat exchange portion comprises a first tube, a second tube and a plurality of heat exchange tubes, the second tube and the first tube are spaced apart from each other, the plurality of heat exchange tubes are spaced apart from each other along a length direction of the first tube, one end of at least one of the heat exchange tubes in a length direction thereof is connected to the first tube, the other end of the at least one heat exchange tube in the length direction thereof is connected to the second tube, so as to communicate the first tube with the second tube, the first communication port is arranged at the first tube, and the second communication port is arranged at the second tube;
    the second heat exchange portion comprises a third tube, a heat exchange component and a fourth tube, the fourth tube and the third tube are spaced apart from each other, the third communication port is arranged at the third tube, the fourth communication port is arranged at the fourth tube, one end of two opposite ends of the heat exchange component is connected to the third tube, the other end of the two opposite ends of the heat exchange component is connected to the fourth tube, the heat exchange component comprises a plurality of channels communicating the third tube with the fourth tube, and at least a part of a surface of the heat exchange component is configured to be in contact with the electronic control assembly;
    the first end of the first connection tube is connected to the first tube through the first communication port, the second end of the first connection tube is connected to the third tube through the third communication port, so as to communicate the first tube with the third tube, the first end of the second connection tube is connected to the second tube through the second communication port, and the second end of the second connection tube is connected to the fourth tube through the fourth communication port, so as to communicate the second tube with the fourth tube;
    when the heat exchange system is in use, a junction of the at least one heat exchange tube of the first heat exchange portion to the second tube is not higher than a junction of the at least one heat exchange tube to the first tube in the direction of gravity, a communication point of at least one of the channels of the second heat exchange portion to the fourth tube is lower than a communication point of the at least one channel to the third tube in the direction of gravity, a position of the third communication port is lower than a position of the first communication port in the direction of gravity, and a position of the fourth communication port is lower than a position of the second communication port in the direction of gravity.

2. The heat exchange system for heat dissipation of the electronic control assembly according to claim 1, wherein the plurality of channels are spaced apart from each other along a length direction of the third tube.

3. The heat exchange system for heat dissipation of the electronic control assembly according to claim 2, wherein the heat exchange component comprises at least one first flat tube, the first flat tube comprises a first side face and a second side face, the first side face and the second side face of the first flat tube are oppositely arranged in a thickness direction of the first flat tube, the first flat tube further comprises a third side face and a fourth side face, the third side face and the fourth side face of the first flat tube are oppositely arranged in a width direction of the first flat tube, a distance between the first side face and the second side face of the first flat tube is less than a distance between the third side face and the fourth side face of the first flat tube, the width direction of the first flat tube is substantially parallel to the length direction of the third tube, one end of two opposite ends of the first flat tube in a length direction of the first flat tube opposite is connected to the third tube, the other end of the two opposite ends of the first flat tube in the length direction of the first flat tube opposite is connected to the fourth tube, the first flat tube comprises the plurality of channels, the plurality of channels are spaced apart from each other along the width direction of the first flat tube, and one side face of the first side face or the second side face of the first flat tube is in contact with the electronic control assembly.

4. The heat exchange system for heat dissipation of the electronic control assembly according to claim 2, wherein the heat exchange component comprises a second component, one end of two oppositely-arranged ends of the second component is connected to the third tube, the other end of the two oppositely-arranged ends of the second component is connected to the fourth tube, the second component comprises the plurality of channels, at least a part of a surface of the second component is configured to be in contact with the electric control assembly, the channel has a length and a width, a length direction of the channel is substantially perpendicular to the length direction of the third tube, and the width of the channel is not greater than a diameter of the third tube or a diameter of the fourth tube.

5. The heat exchange system for heat dissipation of the electronic control assembly according to claim 1, wherein the plurality of channels are divided into a plurality of groups spaced apart from each other along a length direction of the third tube, and the channels in each group are spaced apart from each other.

6. The heat exchange system for heat dissipation of the electronic control assembly according to claim 5, wherein the heat exchange component comprises a plurality of first flat tubes, the plurality of first flat tubes are spaced apart from each other along the length direction of the third tube, and an included angle between a thickness direction of the first flat tube and the length direction of the third tube is greater than or equal to 0° and less than 90°.

7. The heat exchange system for heat dissipation of the electronic control assembly according to claim 1, wherein a plurality of second heat exchange portions are provided, and the plurality of second heat exchange portions are connected in parallel between the first connection tube and the second connection tube.

8. A heat exchange system for heat dissipation of an electronic control assembly, comprising:
a first heat exchange portion comprising a first end of the first heat exchange portion and a second end of the first heat exchange portion arranged opposite to each other, the first end of the first heat exchange portion having a first communication port, the second end of the first heat exchange portion having a second communication port, and the first communication port being in communication with the second communication port;
a second heat exchange portion comprising a first end of the second heat exchange portion and a second end of the second heat exchange portion arranged opposite to each other, the first end of the second heat exchange portion having a third communication port, the second end of the second heat exchange portion having a fourth communication port, the fourth communication port being in communication with the third communication port, and at least a part of the second heat exchange portion being configured to be in contact with the electronic control assembly, so as to be in conduction with the electronic control assembly to dissipate heat;
a first connection tube comprising a first end of the first connection tube and a second end of the first connection tube, the first end of the first connection tube being connected to the first end of the first heat exchange portion through the first communication port, and the second end of the first connection tube being connected to the first end of the second heat exchange portion through the third communication port, so as to communicate the first heat exchange portion with the second heat exchange portion; and
a second connection tube comprising a first end of the second connection tube and a second end of the second connection tube, the first end of the second connection tube being connected to the second end of the first heat exchange portion through the second communication port, and the second end of the second connection tube being connected to the second end of the second heat exchange portion through the fourth communication port, so as to communicate the first heat exchange portion with the second heat exchange portion,
wherein the first heat exchange portion, the first connection tube, the second heat exchange portion and the second connection tube constitute a loop, at least one of the first heat exchange portion, the first connection tube, the second heat exchange portion and the second connection tube has an opening, the opening is closed when the heat exchange system is in an operative state, the second end of the first heat exchange portion is not higher than the first end of the first heat exchange portion in a direction of gravity, the second end of the second heat exchange portion is lower than the first end of the second heat exchange portion in the direction of gravity, the third communication port is lower than the first communication port in the direction of gravity, and the fourth communication port is lower than the second communication port in the direction of gravity;
wherein the first heat exchange portion comprises a second flat tube, the second flat tube comprises a first side face and a second side face, the first side face and the second side face of the second flat tube are oppositely arranged in a thickness direction of the second flat tube, the second flat tube further comprises a third side face and a fourth side face, the third side face and the fourth side face of the second flat tube are oppositely arranged in a width direction of the second flat tube, a distance between the first side face and the second side face of the second flat tube is less than a distance between the third side face and the fourth side face of the second flat tube, the second flat tube comprises a plurality of straight sections and a plurality of curved sections, the plurality of straight sections are spaced apart from each other, two adjacent straight sections are connected through the curved section, the second flat tube comprises a first end of the second flat tube and a second end of the second flat tube, the first communication port is arranged at the first end of the second flat tube, and the second communication port is arranged at the second end of the second flat tube;

the second heat exchange portion comprises a third flat tube, the third flat tube comprises a first side face and a second side face, the first side face and the second side face of the third flat tube are oppositely arranged in a thickness direction of the third flat tube, the third flat tube further comprises a third side face and a fourth side face, the third side face and the fourth side face of the third flat tube are oppositely arranged in a width direction of the third flat tube, a distance between the first side face and the second side face of the third flat tube is less than a distance between the third side face and the fourth side face of the third flat tube, the third flat tube comprises a first end of the third flat tube and a second end of the third flat tube, the third communication port is arranged at the first end of the third flat tube, the fourth communication port is arranged at the second end of the third flat tube, and at least a part of a surface of the third flat tube is configured to be in contact with the electronic control assembly;

the first end of the first connection tube is connected to the first end of the second flat tube through the first communication port, and the second end of the first connection tube is connected to the first end of the third flat tube through the third communication port, so as to communicate the second flat tube with the third flat tube; the first end of the second connection tube is connected to the second end of the second flat tube through the second communication port, and the second end of the second connection tube is connected to the second end of the third flat tube through the fourth communication port, so as to communicate the second flat tube with the third flat tube;

when the heat exchange system is in use, the plurality of straight sections are spaced apart from each other generally along the direction of gravity, the second end of the second flat tube is not higher than the first end of the second flat tube in the direction of gravity, the second end of the third flat tube is lower than the first end of the third flat tube in the direction of gravity, a junction of the first connection tube to the third flat tube is lower than a junction of the first connection tube to the second flat tube, and a junction of the second connection tube to the third flat tube is lower than a junction of the second connection tube to the second flat tube in the direction of gravity.

9. The heat exchange system for heat dissipation of the electronic control assembly according to claim 8, wherein the second flat tube, the first connection tube, the third flat tube and the second connection tube are formed by one continuous tube.

10. The heat exchange system for heat dissipation of the electronic control assembly according to claim 8, further comprising a liquid storage member having a liquid storage cavity, wherein the second end of the second flat tube is connected to the first end of the second connection tube through the liquid storage member, so as to communicate the second flat tube with the second connection tube through the liquid storage cavity.

11. A computer host, comprising:
a chassis;
a main board arranged in the chassis, an electronic control assembly being mounted on the main board and comprising a chip;
a fan or a blower arranged in the chassis; and
a heat exchange system arranged in the chassis, the heat exchange system comprising:
a first heat exchange portion comprising a first end of the first heat exchange portion and a second end of the first heat exchange portion arranged opposite to each other, the first end of the first heat exchange portion having a first communication port, the second end of the first heat exchange portion having a second communication port, and the first communication port being in communication with the second communication port;
a second heat exchange portion comprising a first end of the second heat exchange portion and a second end of the second heat exchange portion arranged opposite to each other, the first end of the second heat exchange portion having a third communication port, the second end of the second heat exchange portion having a fourth communication port, the fourth communication port being in communication with the third communication port, and at least a part of the second heat exchange portion being configured to be in contact with the electronic control assembly, so as to be in conduction with the electronic control assembly to dissipate heat;
a first connection tube comprising a first end of the first connection tube and a second end of the first connection tube, the first end of the first connection tube being connected to the first end of the first heat exchange portion through the first communication port, and the second end of the first connection tube being connected to the first end of the second heat exchange portion through the third communication port, so as to communicate the first heat exchange portion with the second heat exchange portion; and
a second connection tube comprising a first end of the second connection tube and a second end of the second connection tube, the first end of the second connection tube being connected to the second end of the first heat exchange portion through the second communication port, and the second end of the second connection tube being connected to the second end of the second heat exchange portion through the fourth communication port, so as to communicate the first heat exchange portion with the second heat exchange portion,
wherein the first heat exchange portion, the first connection tube, the second heat exchange portion and the second connection tube constitute a loop, at least one of the first heat exchange portion, the first connection tube, the second heat exchange portion and the second connection tube has an opening, the opening is closed when the heat exchange system is in an operative state, the second end of the first heat exchange portion is not higher than the first end of the first heat exchange portion in a direction of gravity, the second end of the second heat exchange portion is lower than the first end of the second heat exchange portion in the direction of gravity, the third communication port is lower than the first communication port in the direction of gravity, and the fourth communication port is lower than the second communication port in the direction of gravity, wherein the first heat exchange portion comprises a first tube, a second tube and a plurality of heat exchange tubes, the second tube and the first tube are spaced apart from each other, the plurality of heat exchange tubes are spaced apart from each other along a length direction of the first tube, one end of at least one of the heat exchange tubes in a length direction thereof is connected to the first tube, the other end of the at least one heat exchange tube in the length direction thereof is connected to the second tube, so as to communicate the first tube with the second tube, the first communication port is arranged at the first tube, and the second communication port is arranged at the second tube;

the second heat exchange portion comprises a third tube, a heat exchange component and a fourth tube, the fourth tube and the third tube are spaced apart from each other, the third communication port is arranged at the third tube, the fourth communication port is arranged at the fourth tube, one end of two opposite ends of the heat exchange component is connected to the third tube, the other end of the two opposite ends of the heat exchange component is connected to the fourth tube, the heat exchange component comprises a plurality of channels communicating the third tube with the fourth tube, and at least a part of a surface of the heat exchange component is configured to be in contact with the electronic control assembly;

the first end of the first connection tube is connected to the first tube through the first communication port, the second end of the first connection tube is connected to the third tube through the third communication port, so as to communicate the first tube with the third tube, the first end of the second connection tube is connected to the second tube through the second communication port, and the second end of the second connection tube is connected to the fourth tube through the fourth communication port, so as to communicate the second tube with the fourth tube;

when the heat exchange system is in use, a junction of the at least one heat exchange tube of the first heat exchange portion to the second tube is not higher than a junction of the at least one heat exchange tube to the first tube in the direction of gravity, a communication point of at least one of the channels of the second heat exchange portion to the fourth tube is lower than a communication point of the at least one channel to the third tube in the direction of gravity, a position of the third communication port is lower than a position of the first communication port in the direction of gravity, and a position of the fourth communication port is lower than a position of the second communication port in the direction of gravity;

wherein the first heat exchange portion is arranged adjacent to the fan or the blower, a spacing is defined between the second heat exchange portion and the first heat exchange portion in a horizontal direction, at least a part of a surface of the second heat exchange portion is in contact with the chip, the second end of the first heat exchange portion is lower than the first end of the first heat exchange portion in the direction of gravity, the second end of the second heat exchange portion is lower than the first end of the second heat exchange portion in the direction of gravity, the third communication port is lower than the first communication port in the direction of gravity, and the fourth communication port is lower than the second communication port in the direction of gravity.

12. A heat exchange system for heat dissipation of an electronic control assembly, comprising:

a first heat exchange assembly comprising a first tube, a second tube and a plurality of heat exchange tubes, the second tube and the first tube being spaced apart from each other, the plurality of heat exchange tubes being spaced apart from each other along a length direction of the first tube, one end of at least one of the heat exchange tubes in a length direction thereof being connected to the first tube, the other end of the at least one heat exchange tube in the length direction thereof being connected to the second tube, so as to communicate the first tube with the second tube, the first tube having a first communication port, and the second tube having a second communication port;

a second heat exchange assembly comprising a third tube, a heat exchange component and a fourth tube, the fourth tube and the third tube being spaced apart from each other, the third tube having a third communication port, the fourth tube having a fourth communication port, the heat exchange component comprising a first component and at least one first flat tube, the first flat tube comprising a first side face and a second side face, the first side face and the second side face of the first flat tube being oppositely arranged in a thickness direction of the first flat tube, the first flat tube further comprising a third side face and a fourth side face, the third side face and the fourth side face of the first flat tube being oppositely arranged in a width direction of the first flat tube, a distance between the first side face and the second side face of the first flat tube being less than a distance between the third side face and the fourth side face of the first flat tube, one end of two opposite ends of the first flat tube in a length direction thereof being connected to the third tube, the other end of the two opposite ends of the first flat tube in the length direction thereof being connected to the fourth tube, the first flat tube comprising a plurality of first channels, the plurality of first channels being spaced apart from each other in the width direction of the first flat tube, the first channel extending in a length direction of the first flat tube, so as to communicate the third tube with the fourth tube, a part of the first component being in contact with the first side face or the second side face of the first flat tube, and at least a part of the rest of the first component being configured to be in contact with the electronic control assembly, so as to be in conduction with the electronic control assembly to dissipate heat;

a first connection tube comprising a first end of the first connection tube and a second end of the first connection tube, the first end of the first connection tube being connected to the first tube through the first communication port, and the second end of the first connection tube being connected to the third tube through the third communication port, so as to communicate the first tube with the third tube; and a second connection tube comprising a first end of the second connection tube and a second end of the second connection tube, the first end of the second connection tube being connected to the second tube through the second communication port, and the second end of the second connection tube being connected to the fourth tube through the fourth communication port, so as to communicate the second tube with the fourth tube, wherein when the heat exchange system is in use, a junction of the at least one heat exchange tube of the first heat exchange assembly to the second tube is not higher than a junction of the at least one heat exchange tube to the first tube in a direction of gravity, a junction of the at least one first flat tube of the second heat exchange assembly to the fourth tube is lower than a junction of the at least one first flat tube to the third tube in the direction of gravity, a position of the third communication port is lower than a position of the first communication port in the direction of gravity, and a position of the fourth communication port is lower than a position of the second communication port in the direction of gravity.

13. The heat exchange system for heat dissipation of the electronic control assembly according to claim 12, wherein a plurality of first flat tubes are provided, the plurality of first flat tubes are spaced apart from each other along a length direction of the third tube, and an included angle between the thickness direction of the first flat tube and the length direction of the third tube is greater than or equal to 0° and less than 90°.

14. The heat exchange system for heat dissipation of the electronic control assembly according to claim 13, wherein the first component comprises a first side face and a second side face arranged opposite to each other, the first side face of the first component is configured to be in contact with the electronic control assembly, the first component has a plurality of first slot holes, the first slot hole comprises an open end and a closed end, the open end of the first slot hole is arranged in the second side face of the first component, a connection portion is arranged between the closed end of the first slot hole and the first side face of the first component, the plurality of first slot holes are spaced apart from each other along the length direction of the third tube, the first flat tube is fitted and arranged in the first slot hole, so as to be in contact with the first component, the first slot hole comprises a bottom face and a side wall face, at least one side face of the third side face or the fourth side face of the first flat tube is in contact with the side wall face of the first slot hole, and the first side face or the second side face of the first flat tube is in contact with the bottom face of the first slot hole.

15. The heat exchange system for heat dissipation of the electronic control assembly according to claim 14, wherein the first component is formed by a plurality of first blocks spliced together, the first block has a thickness direction substantially parallel to the length direction of the third tube, and the plurality of first blocks are arranged sequentially along the length direction of the third tube.

16. The heat exchange system for heat dissipation of the electronic control assembly according to claim 14, wherein the first component comprises a second block and a plurality of third blocks, the plurality of third blocks are spaced apart from each other along the length direction of the third tube, the second block comprises a first surface and a second surface arranged opposite to each other, the first surface of the second block is the first side face of the first component, the second surface of the second block has a second slot hole, the plurality of third blocks are partially arranged in the second slot hole, the second slot hole comprises a bottom face, a plurality of protrusions are arranged on the bottom face of the second slot hole, the plurality of protrusions are spaced apart from each other along the length direction of the third tube, the protrusion is located between adjacent third blocks, and the third side face or the fourth side face of the first flat tube is in contact with the protrusion.

17. The heat exchange system for heat dissipation of the electronic control assembly according to claim 16, wherein the third block comprises two opposite side faces, one side face of the two side faces of the third block is in contact with the bottom face of the second slot hole, and the other side face of the two side faces of the third block is located outside the second slot hole.

18. The heat exchange system for heat dissipation of the electronic control assembly according to claim 13, wherein the first flat tube comprises a first section, a first curved section, a middle section, a second curved section and a second section, one end of the first section in a length direction thereof is connected to the third tube, the other end of the first section in the length direction thereof is connected to one end of the first curved section, the other end of the first curved section is connected to one end of the middle section in a length direction thereof, the other end of the middle section in the length direction thereof is connected to one end of the second curved section, the other end of the second curved section is connected to one end of the second section in a length direction thereof, the other end of the second section in the length direction thereof is connected to the fourth tube, a first side face of the first section has a first side edge extending in the length direction of the first section, a first side face of the middle section has a middle side edge extending in the length direction of the middle section, a first side face of the second section has a second side edge extending in the length direction of the second section, the first side edge and the middle side edge are angled, and the second side edge and the middle side edge are angled.

19. The heat exchange system for heat dissipation of the electronic control assembly according to claim 12, wherein the width direction of the first flat tube is generally parallel to a length direction of the third tube, the first component comprises a first side face and a second side face arranged opposite to each other, the first side face of the first component is configured to be in contact with the electronic control assembly, the first component has a third slot hole, the third slot hole comprises an open end and a closed end, the open end of the third slot hole is arranged in the second side face of the first component, a connection portion is arranged between the closed end of the third slot hole and the first side face of the first component, the at least one first flat tube is fitted and arranged in the third slot hole, so as to be in contact with the first component, the third slot hole comprises a bottom face and a side wall face, the first side face or the second side face of the first flat tube is in contact with the bottom face of the third slot hole, and at least one side face of the third side face or the fourth side face of the first flat tube is in contact with the third slot hole.

* * * * *